(12) United States Patent
Goto et al.

(10) Patent No.: US 7,260,448 B2
(45) Date of Patent: Aug. 21, 2007

(54) SUBSTRATE HOLDING DEVICE

(75) Inventors: Hirohiko Goto, Akashi (JP); Shiro Oda, Anjo (JP)

(73) Assignee: Kawasaki Jukogyo Kabushiki Kaisha, Kobe (JP)

( * ) Notice: Subject to any disclaimer, the term of this patent is extended or adjusted under 35 U.S.C. 154(b) by 47 days.

(21) Appl. No.: 10/959,163

(22) Filed: Oct. 7, 2004

(65) Prior Publication Data
US 2005/0123383 A1 Jun. 9, 2005

(30) Foreign Application Priority Data
Oct. 8, 2003 (JP) .............................. 2003-349628

(51) Int. Cl.
*G06F 7/00* (2006.01)
(52) U.S. Cl. ..................... 700/218; 414/937
(58) Field of Classification Search ................ 700/218, 700/214; 414/416.08, 935, 937, 939, 941
See application file for complete search history.

(56) References Cited

U.S. PATENT DOCUMENTS

| | | | | |
|---|---|---|---|---|
| 5,636,960 A * | 6/1997 | Hiroki et al. | ............... | 414/781 |
| 5,741,109 A * | 4/1998 | Wiesler et al. | ......... | 414/416.08 |
| 5,954,472 A * | 9/1999 | Hofmeister et al. | ..... | 414/744.5 |
| 6,053,694 A * | 4/2000 | Dill | ............... | 414/778 |
| 6,120,229 A * | 9/2000 | Hofmeister | ................ | 414/217 |
| 6,450,755 B1 * | 9/2002 | Cameron et al. | ...... | 414/416.08 |
| 6,915,183 B2 * | 7/2005 | Iida et al. | .................... | 700/218 |
| 6,973,370 B2 * | 12/2005 | Ito et al. | ..................... | 700/218 |
| 2001/0051081 A1 * | 12/2001 | Wagner et al. | .............. | 414/217 |

FOREIGN PATENT DOCUMENTS

| | | |
|---|---|---|
| JP | 05-214535 | 8/1993 |
| JP | 06-183512 | 7/1994 |
| JP | 08-139160 | 5/1996 |
| JP | 08-148503 | 6/1996 |
| JP | 11-163096 | 6/1996 |
| JP | A 2000-174099 | 6/2000 |
| JP | 2002-299421 | 10/2002 |

* cited by examiner

*Primary Examiner*—Khoi H. Tran
(74) *Attorney, Agent, or Firm*—Oliff & Berridge, PLC

(57) ABSTRACT

A substrate holding device includes: holding members configured to hold substrates, the holding members being arranged along a predetermined arranging direction and being movable along the arranging direction; an interlocking mechanism interlocking the holding members for simultaneous coordinate movement along the arranging direction to change intervals between the holding members with respect to the arranging direction; driving unit for driving the holding members for shifting at least along the arranging direction; and control unit for controlling the driving unit to shift the holding members to substrate taking positions where the holding members are able to hold substrates, respectively, in accordance with a mapping information about a condition of arrangement of the substrates arranged along the arranging direction.

13 Claims, 13 Drawing Sheets

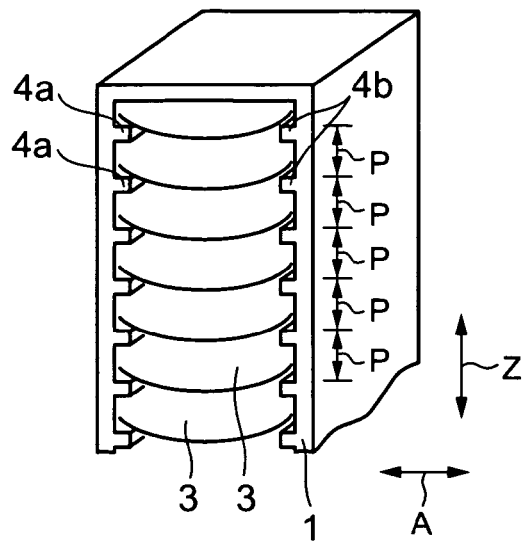 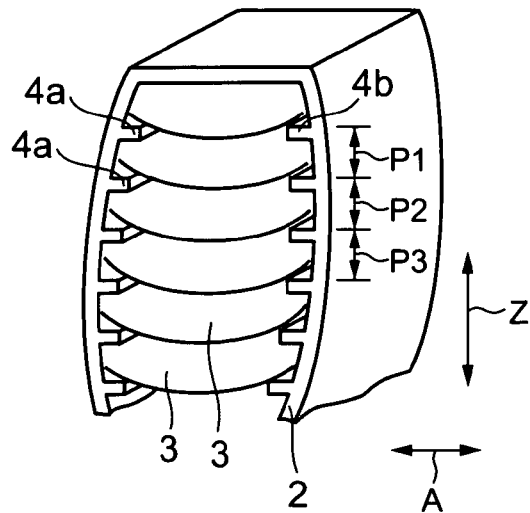
FIG. 16A  FIG. 16B
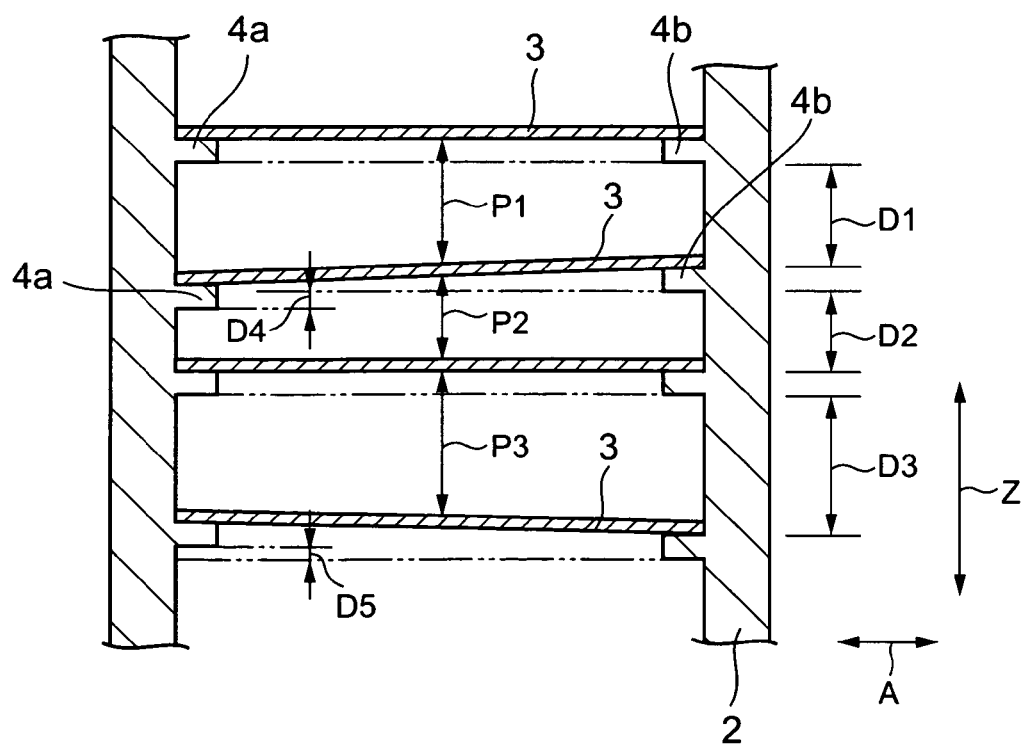
FIG. 17

SUBSTRATE HOLDING DEVICE

BACKGROUND OF THE INVENTION

1. Field of the Invention

The present invention relates to a substrate holding device capable of holding a plurality of thin substrates, such as semiconductor wafers or glass substrates.

2. Description of the Related Art

A plurality of semiconductor wafers (hereinafter, referred to simply as "wafers") are stacked in a vertical arrangement in a cassette for carrying. A semiconductor device fabricating apparatus processes a plurality of wafers stacked in a vertical arrangement in a process substrate holder by a predetermined process. A substrate holding device holds a plurality wafers, and carries the plurality of wafers simultaneously between a cassette and the process substrate holder.

In some cases, wafers are stacked at different pitches in a cassette and a process substrate holder, respectively. A substrate holding device disclosed in JP-A No. 2000-174099 intended to deal with such cases adjusts the pitches of wafers on the basis of the respective predetermined initial conditions of the cassette and the process substrate holder by a predetermined adjustment.

FIGS. 16A and 16B are perspective views of process substrate holders 1 and 2. It is possible that the process substrate holder undergoes secular distortion due to exposure to process heat. FIG. 16A shows the process substrate holder 1 in an initial state and FIG. 16B shows a distorted process substrate holder 2 undergone secular distortion.

Referring to FIG. 16A, the new process substrate holder 1 in the initial state is provided with pairs of projections 4a and 4b. The projections 4a and the corresponding projections 4b are in a horizontal plane. The projections 4a and 4b are arranged vertically at equal pitches P in the direction of the arrow Z. Each pair of projections 4a and 4b holds a wafer 3 thereon. Thus the wafers 3 are held horizontally at equal pitches P in the new process substrate holder 1.

When the semiconductor device fabricating apparatus processes the wafers 3 by a hot process, it is possible that the process substrate holder 1 undergoes secular distortion when the process substrate holder is used for a long time in a hot atmosphere. FIG. 17 is a fragmentary sectional view of the process substrate holder 2 undergone secular distortion. The secular distortion of the process substrate holder 2 is exaggerated in FIG. 17 to facilitate understanding. As shown in FIG. 17, in the process substrate holder 2 distorted by aging, vertical intervals D1, D2 and D3 between the projections 4a and 4b have been changed and, consequently, the wafers 3 are arranged at different pitches P1, P2 and P3. For example, even if the wafers 3 are arranged at equal pitches P of 6.3 mm in the new process substrate holder 1, the wafers 3 are arranged at irregular pitches between 6.0 and 6.6 mm in the process substrate holder 2 undergone secular distortion. Although the projections 4a and the corresponding projections 4b are in the same horizontal planes, respectively, in the new process substrate holder 1, the projections 4a and the corresponding projections 4b of the process substrate holder 2 are dislocated vertically relative to each other, respectively, and the levels of the projections 4a and those of the corresponding projections 4b differ from each other by differences D4 and D5, respectively. Consequently, the wafers 3 are held in sloping positions in the process substrate holder 2.

The prior substrate holding device is able to hold wafers 3 only at pitches determined at the introduction of the substrate holding device into a semiconductor device fabricating system. Therefore, the prior substrate holding device is incapable of coping with the irregular change of the pitches of the wafers 3 due to the secular distortion of the process substrate holder and often fails in holding the wafers 3 causing a significant reduction in the yield of the processed wafers 3. The same problem arises when the pitches of the wafers 3 in the cassette are changed.

The prior substrate holding device is incapable of coping with changes in the arrangement of wafers. Although problems that arise when the substrate holding device is applied to holding wafers have been described above, the same problem arise when the substrate holding device is applied to holding a plurality of substrates other than wafers.

SUMMARY OF THE INVENTION

Accordingly, it is an object of the present invention to provide a substrate holding device capable of surely holding substrates regardless of the condition of arrangement of the substrates.

A substrate holding device in a first aspect of the present invention includes: a plurality of holding members configured to hold a plurality of substrates, the holding members being arranged along a predetermined arranging direction and being movable along the arranging direction; an interlocking mechanism interlocking the holding members for simultaneous coordinate movement along the arranging direction to change intervals between the holding members with respect to the arranging direction; driving means for driving the holding members for shifting at least along the arranging direction; and control means for controlling the driving means to shift the holding members to substrate taking positions where the holding members are able to hold substrates, respectively, in accordance with a mapping information about a condition of arrangement of the substrates arranged along the arranging direction.

According to the present invention, the control means controls the driving means on the basis of the mapping information about the condition of arrangement of the substrates, and the interlocking mechanism moves the holding members coordinately to the substrate taking positions where the holding members are able to reach and hold the substrates. The holding members moved to the substrate taking positions advance into spaces between the substrates arranged in the arranging direction and hold the substrates, respectively. Since the positions of the holding members with respect to the arranging direction are adjusted according to the condition of arrangement of the substrates, the substrate holding device is able to hold the plurality of substrates surely and simultaneously regardless of the condition of arrangement of the substrates.

Suppose that the pitches of substrates held in a substrate holder are changed due to the secular distortion of the substrate holder. Then, the substrate holding device adjusts the relative positions of the holding members with respect to the arranging direction on the basis of the actual pitches of the substrates, and then the holding members are operated to hold the substrates. The holding members are able to enter the spaces between the substrates with proper clearances formed between the holding members and the substrates without colliding against the substrates. Thus the holding members are able to hold the substrates without damaging the substrates.

Preferably, in the substrate holding device according to the present invention, at least one of the holding members is a projectable holding member which is able to move in a jutting direction intersecting the arranging direction. The driving means drives the projectable holding member for shifting along the jutting direction. The control means controls the driving means, when it is impossible to hold the substrates by the holding members, respectively, even if the holding members are shifted in the arranging direction, so that the projectable holding member is shifted along the jutting direction and holds a substrate in accordance with the mapping information, and then a rest of holding members are shifted to substrate taking positions where the rest of holding members are able to hold a rest of substrates, respectively.

According to the present invention, when the holding members are unable to hold the substrates even if the holding members are shifted with respect to the arranging direction on the basis of the mapping information, the control means moves the projectable holding member such that the projectable holding member juts out from the vertical stack of the rest of the holding members, the projectable holding member advances into the space between the adjacent substrate and holds the substrate. The projectable holding member holds and takes out the substrate obstructing the simultaneous holding of the rest of the substrates to enable the simultaneous holding of the rest of the substrates. Then, the rest of the holding members are advanced into the spaces between the substrates to hold the rest of the substrates simultaneously by the holding members.

Thus, even if the substrates are held in an arrangement that makes the simultaneous holding of the substrates impossible, the projectable holding member juts out to take out the substrate obstructing the simultaneous holding of the substrates so that the rest of the substrates can be simultaneously held. Consequently, the plurality of substrates can be surely and simultaneously held.

Preferably, the substrate holding device further comprises chuck means for positioning the substrate held on the holding member, the chuck means having a movable chuck which is configured to be moved between a first position where the movable chuck is in contact with a circumference of the substrate held on the holding member and a second position where the movable chuck is retracted from the first position.

Thus, the substrate can be held on the holding member in accurate position.

A substrate holding device in a second aspect of the present invention includes: a plurality of holding members arranged along a predetermined arranging direction, at least one of the holding members being a projectable holding member which is able to move in a jutting direction intersecting the arranging direction; driving means for driving the projectable holding member for shifting along the jutting direction; and control means for controlling the driving means, when it is impossible to hold the substrates by the holding members, respectively, to shift the projectable holding member so as to hold a substrate in accordance with a mapping information about a condition of arrangement of the substrates arranged along the arranging direction.

According to the present invention, the control means moves the projectable holding member such that the projectable holding member juts out from the vertical stack of the rest of the holding members when the holding members are unable to hold the substrates. The projectable holding member advances into the space between the substrates and holds the substrate. The projectable holding member holds and takes out the substrate obstructing the simultaneous holding of the rest of the substrates to enable the simultaneous holding of the rest of the substrates. Then, the rest of the holding members are advanced into the spaces between the substrates to hold the rest of the substrates simultaneously by the holding members.

Thus, even if the substrates are held in an arrangement that makes the simultaneous holding of the substrates impossible, the projectable holding member is moved to enable the plurality of substrates to be held simultaneously. Consequently, the plurality of substrates can be still more surely and simultaneously held.

Preferably, the substrate holding device according to the present invention further includes mapping means for determining the condition of arrangement of the substrates arranged along the arranging direction.

According to the present invention, the control means receives mapping information about the condition of arrangement of the substrates from the mapping means before holding the substrates on the holding members, and shifts the holding members on the basis of the mapping information. The holding members thus properly shifted are able to hold the substrates surely and simultaneously even if the substrates are held in an arrangement different from a predetermined reference arrangement. The condition of arrangement of the substrates can be confirmed by the mapping operation of the mapping means immediately before the holding members are driven for a substrate holding operation, and hence the substrates can be more accurately held.

Preferably, in the substrate holding device according to the present invention, the interlocking mechanism includes a linkage having a plurality of links which are linked so as to turn relative to each other, and capable of shifting the holding members along the arranging direction to change intervals between the holding members. The driving means drives at least one of the links for angular displacement.

According to the present invention, the linkage is able to move the holding members simultaneously along the arranging direction when the driving means drives at least one of the links for angular displacement.

A substrate holding device in a comparative example that transmits the driving force of a driving means to holding members by a ball screw including a threaded rod needs to turn the threaded rod, namely, a sliding member, several turns. According to the present invention, the driving force of the driving means can be transmitted to the holding members simply by turning the links of the linkage through small angles. The sliding members of the linkage, as compared with the components of the ball screw, are small. Since the links of the linkage needs to be turned through only small angles and the sliding members of the linkage are small, the linkage does not produce much dust.

A substrate holding device in a third aspect of the present invention includes: an odd number, which is not less than three, of holding members arranged along a predetermined arranging direction and capable of being shifted along the arranging direction, the holding members including a middle holding member which is located at a middle position in the arranging direction; a linkage including a plurality of links linked for angular displacement so as to shift the holding members along the arranging direction to change intervals between the holding members, the links including a plurality of driven links having ends pivotally joined to the holding members excluding the middle holding member, and a driving link pivotally joined to the middle holding member so as to be able to turn about a reference axis passing the middle holding member perpendicularly to the arranging direction and pivotally joined to other ends of the driven links; driving means for driving the driving link for angular displacement about the reference axis; and control means for controlling the driving means so that the holding members are shifted to substrate taking positions where the holding members are able to hold substrates.

According to the present invention, the driving means drives the holding members to shift the holding members to the substrate taking positions where the holding members are able to hold the substrates, and then the holding members advance into spaces between the substrates arranged along the arranging direction. The positions of the holding members are adjusted according to the condition of arrangement of the substrates such that the holding members are able to hold the plurality of substrates simultaneously. The linkage is able to move the holding members coordinately along the arranging direction when the driving means drives the driving link for angular displacement.

When the driving force of the driving means is transmitted to the holding members by a ball screw including a threaded rod, the threaded rod, namely, a sliding member, needs to be turned several turns. According to the present invention, the driving force of the driving means can be transmitted to the holding members by the linkage simply by turning the links of the linkage through small angles. Sliding members of the linkage, as compared with the components of the ball screw, are small. Since the links of the linkage needs to be turned through only small angles and the sliding members of the linkage are small, the linkage does not produce much dust.

According to the present invention, the holding members on the opposite sides of the middle holding member are moved toward or away from the middle holding member. The holding members on one of the opposite sides of the middle holding member and those on the other side of the middle member are moved coordinately in opposite directions, respectively, to change distances between the holding members.

In a substrate holding device in a comparative example provided with a linkage that moves holding members relative to one holding member at one end of the stack of the holding members needs large links as compared with the links of the linkage included in the substrate holding device of the present invention. In other words, the link of the linkage of the substrate holding device according to the present invention connected to the holding member at the other end of the stack of the holding members is short as compared with the corresponding link of the linkage of the substrate holding device in the comparative example, and hence the driving means for driving the linkage of the substrate holding device according to the present invention may be of a small power capacity. Since all the driven links are joined to the driving link, the linkage has the least unavoidable play.

Preferably, in the substrate holding device according to the present invention, the ends of the driven links, which are pivotally joined to the holding members excluding the middle holding member, are arranged in a line at equal intervals along a first straight line included in a plane perpendicular to the reference axis, and the other ends of the driven links and the reference axis are arranged in a line at equal intervals along a second straight line included in a plane perpendicular to the reference axis.

According to the present invention, the equal intervals with respect to the arranging direction between the holding members change equally when the driving means drives the driving link about the reference axis for angular displacement.

Preferably, in the substrate holding device according to the present invention, when the holding members are adapted to be moved in a predetermined carrying direction toward the substrates, the driving link and the driven links are extended in a plane perpendicular to the carrying direction on a back side with respect to the carrying direction.

According to the present invention, the driving link and the driven links are on the back side with respect to the carrying direction in which the holding members are advanced and are extended in a plane perpendicular to the carrying direction. Consequently, the substrate holding device has a small dimension along the carrying direction and needs small space for installation.

A substrate carrying system in a fourth aspect of the present invention includes: any one of the foregoing substrate holding devices according to the present invention; and a moving device for moving the substrate holding device.

According to the present invention, the moving device moves the substrate holding device to a substrate taking position so as to advance the holding members into spaces between adjacent ones of a plurality substrates arranged at the substrate taking position. Subsequently, the moving device moves the substrate holding device to hold the substrates on the holding members. Then, the moving device moves the substrates held on the holding members to a delivery position. Since the substrate holding device can surely and simultaneously hold the plurality of substrates, the substrate holding device is able to carry the plurality of substrates from the substrate taking position to the delivery position without damaging the substrates.

A substrate holding method in a fifth aspect of the present invention using a plurality of holding members arranged along a predetermined arranging direction so as to be movable along the arranging direction, the holding members being configured to simultaneously hold a plurality of substrates arranged along the arranging direction, the substrate holding method includes: obtaining mapping information about a condition of arrangement of the substrates; calculating pitches of the holding members with respect to the arranging direction based on the mapping information; and holding the substrates on the holding members after shifting the holding members along the arranging direction so that the holding members are arranged at calculated pitches.

According to the present invention, the pitches of the holding members with respect to the arranging direction are calculated on the basis of mapping information, the holding members are shifted along the arranging direction such that the holding members are arranged at the calculated pitches, and the plurality of substrates are held simultaneously on the holding members. Thus the holding members can be set at positions corresponding to those of the substrates, respectively, by adjusting the pitches of the holding members on the basis of the mapping information. Therefore, the substrates can be surely and simultaneously held on the holding members.

A substrate holding method in a sixth aspect of the present invention using a plurality of holding members arranged along a predetermined arranging direction and including at least one projectable holding member capable of being moved in a jutting direction perpendicular to the arranging direction, the holding members being configured to simultaneously holds a plurality of substrates arranged along the arranging direction, the substrate holding method includes: obtaining a mapping information about a condition of arrangement of the substrates; shifting the projectable holding member, when it is impossible to hold the substrates by the holding members, respectively, so as to hold a substrate so that rest of the substrates can be held on rest of the holding members in accordance with the mapping information; and holding the rest of the substrates on the rest of the holding members.

According to the present invention, when the holding members are unable to hold the substrates, the projectable holding member holds the substrate to set a state where the rest of the holding members are able to hold the rest of the substrates. After such a state has been set, the rest of the holding members hold the rest of the substrates surely and simultaneously.

According to the first aspect of the present invention, the holding members are moved coordinately along the arranging direction on the basis of the mapping information about the condition of arrangement of the substrates. Thus the holding members are able to hold the plurality of substrates surely and simultaneously regardless of the condition of arrangement of the substrates. The holding members set at the proper positions with respect to the arranging direction are able to advance into spaces between the substrates with a proper clearance formed between the holding members and the adjacent substrates and to hold the substrates without damaging the substrates. Since sufficient clearances can be formed, the holding members can be quickly advanced into the spaces between the substrates to achieve a quick substrate holding operation.

Thus the plurality of substrates can be simultaneously held on the holding members without damaging the substrates and, consequently, the yield of the processed substrates can be improved. Even if the process substrate holder is distorted, the substrate holding device is able to hold the substrates held by the distorted process substrate holder and, consequently, the life of the process substrate holder can be extended.

According to the present invention, when the holding members are unable to hold the substrates even if the holding members are shifted with respect to the arranging direction on the basis of the mapping information, the projectable holding member juts out and holds the substrate to make the rest of the holding members be able to hold the rest of the substrates simultaneously.

In some cases, some space between the substrates is narrow and an insufficient clearance is formed between the holding member advanced into the narrow space and the adjacent substrates. In such a case, the substrate adjacent to the narrow space is taken out from the substrate holder by the projectable holding member so that all the spaces between the remaining substrates are wide enough for the holding members advance therein. In this state, the rest of the holding members are advanced into the spaces to hold the rest of the substrates simultaneously. Thus it is scarcely possible that the holding members touch the substrates when the same advance into the spaces between the substrates. Since sufficient clearances are formed between the holding members and the adjacent substrates, the plurality of holding members can be quickly advanced into the spaces between the substrates without making the holding members touch the substrates even if the moving holding members shake.

According to the second aspect of the present invention, the projectable holding member is moved in the jutting direction to hold the substrate when the holding members are unable to hold the substrates, to set a state where the plurality of substrates can be simultaneously held on the holding members, and the rest of the plurality of substrates can be simultaneously held on the holding members.

In some cases, some space between the substrates is narrow and an insufficient clearance is formed between the holding member advanced into the narrow space and the adjacent substrates. In such a case, a wide space is formed for the holding member between the adjacent substrates by taking out one of the adjacent substrates defining the narrow space. After forming the wide space, the holding members are advanced into the spaces between the substrates to hold the rest of the substrates on the holding members. Thus it is scarcely possible that the advanced holding members touch the substrates because the substrate adjacent to the narrow space is taken out from the substrate holder by the projectable holding member so that all the spaces between the remaining substrates are wide enough to receive the holding members therein. In this state, the rest of the holding members are advanced into the spaces to hold the rest of the substrates simultaneously. Thus it is scarcely possible that the holding members touch the substrates when the same advance into the spaces between the substrates. Since sufficient clearances are formed between the holding members and the adjacent substrates, the plurality of holding members can be quickly advanced into the spaces between the substrates without making the holding members touch the substrates even if the moving holding members shake.

According to the present invention, the mapping means obtains the mapping information about the condition of arrangement of the substrates before holding the substrates, and the control means shifts the holding members on the basis of the mapping information. Thus, even if the substrates are held in an arrangement different from a predetermined arrangement, the holding members are shifted and the substrates can be surely and simultaneously held on the holding members. The condition of arrangement of the substrates can be confirmed by the mapping operation of the mapping means immediately before the holding members are driven for a substrate holding operation, and hence the substrates can be more accurately held.

According to the present invention, the driving means drives at least one of the links of the linkage for angular displacement and hence the sliding parts do not produce much dust. Therefore, even if the substrate holding device operates to handle the substrates in a regulated atmosphere, such as an atmosphere of a clean room, the substrates can be prevented from contamination, and the quality of the substrates handled by the substrate holding device can be improved. Consequently, the yield is improved and the production cost can be reduced.

According to the third aspect of the present invention, the driving means drives at least one of the links of the linkage for angular displacement and hence the sliding parts do not produce much dust. Therefore, even if the substrate holding device operates to handle the substrates in a regulated atmosphere, such as an atmosphere of a clean room, the substrates can be prevented from contamination, and the quality of the substrates handled by the substrate holding device can be improved. Consequently, the yield is improved and the production cost can be reduced.

According to the present invention, the holding members on the opposite sides of the middle holding member are moved toward and away from the middle holding member. Therefore, moment of force necessary for coordinately moving the holding members can be reduced. Consequently, driving means may be of a small power capacity, the substrate holding device can be formed in small dimensions and can be manufactured at a low manufacturing cost.

In the substrate holding device according to the present invention, the equal intervals with respect to the arranging direction between the holding members can be equally changed.

In the substrate holding device according to the present invention, the driving link and the driven links are extended in a plane perpendicular to the carrying direction on the back side with respect to the carrying direction. Therefore, the substrate holding device has a small dimension along the carrying direction and needs small space for installation. Thus the substrate holding device is suitable for operations in a clean room.

According to the present invention, the substrate holding device is capable of surely and simultaneously holding the plurality of substrates and of surely carrying the plurality of substrates from the substrate taking position to the delivery position without damaging the substrates. Even if the substrates are held irregularly in the substrate holder, the plurality of substrates can be surely and simultaneously carried.

The substrate holding method in the fifth aspect of the present invention calculates pitches of the holding members with respect to the arranging direction on the basis of the mapping information, shifts the holding members along the arranging direction such that the holding members are arranged at the calculated pitches, and holds the plurality of substrates simultaneously. Since the pitches of the holding members can be adjusted on the basis of the mapping information, the pitches of the holding members with respect to the arranging direction can be adjusted according to the condition of arrangement of the substrates. Thus the plurality of substrates can be surely held on the holding members even if the arrangement of the substrates changes.

The substrate holding method in the sixth aspect of the present invention makes the projectable holding member jut out, when the holding members are unable to hold the substrates, to hold the substrate so that the rest of the substrates can be held on the rest of the holding members. Thus the substrates are held on the holding members after the arrangement of the substrates has been modified so that the substrates can be held on the holding members, and hence the plurality of substrates can be surely held on the holding members.

BRIEF DESCRIPTION OF THE DRAWINGS

The above and other objects, features and advantages of the present invention will become more apparent form the following description taken in connection with the accompanying drawings, in which:

FIGS. 16A and 16B are perspective views of assistance in explaining process substrate holders; and FIG. 17 is a sectional view of the process substrate holder shown in FIG. 16B.

DESCRIPTION OF THE PREFERRED EMBODIMENTS

Figure 1:
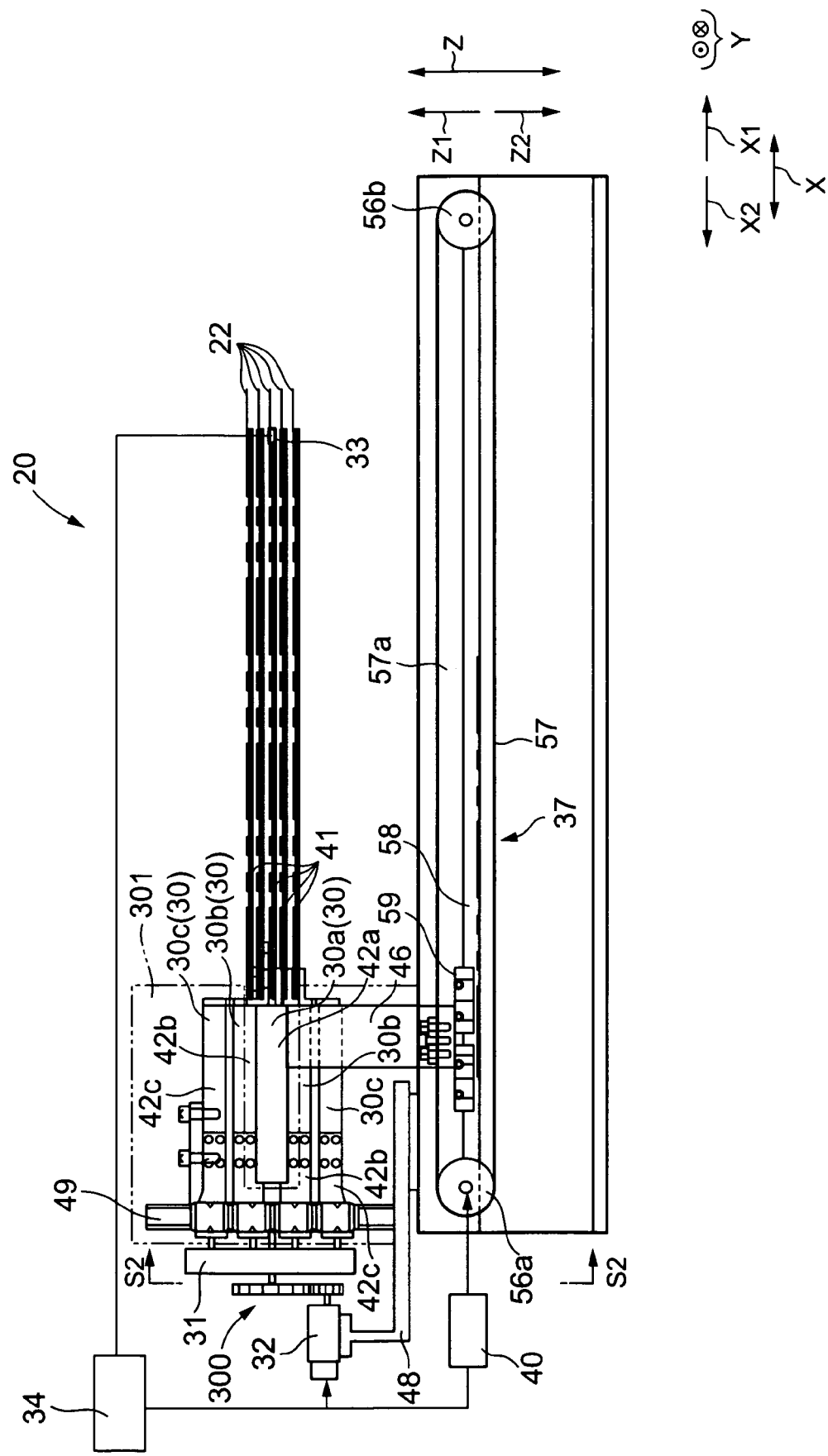
FIG. 1 is a partly sectional side elevation of a substrate carrying system including a substrate holding device in a first embodiment according to the present invention.
Figure 2:
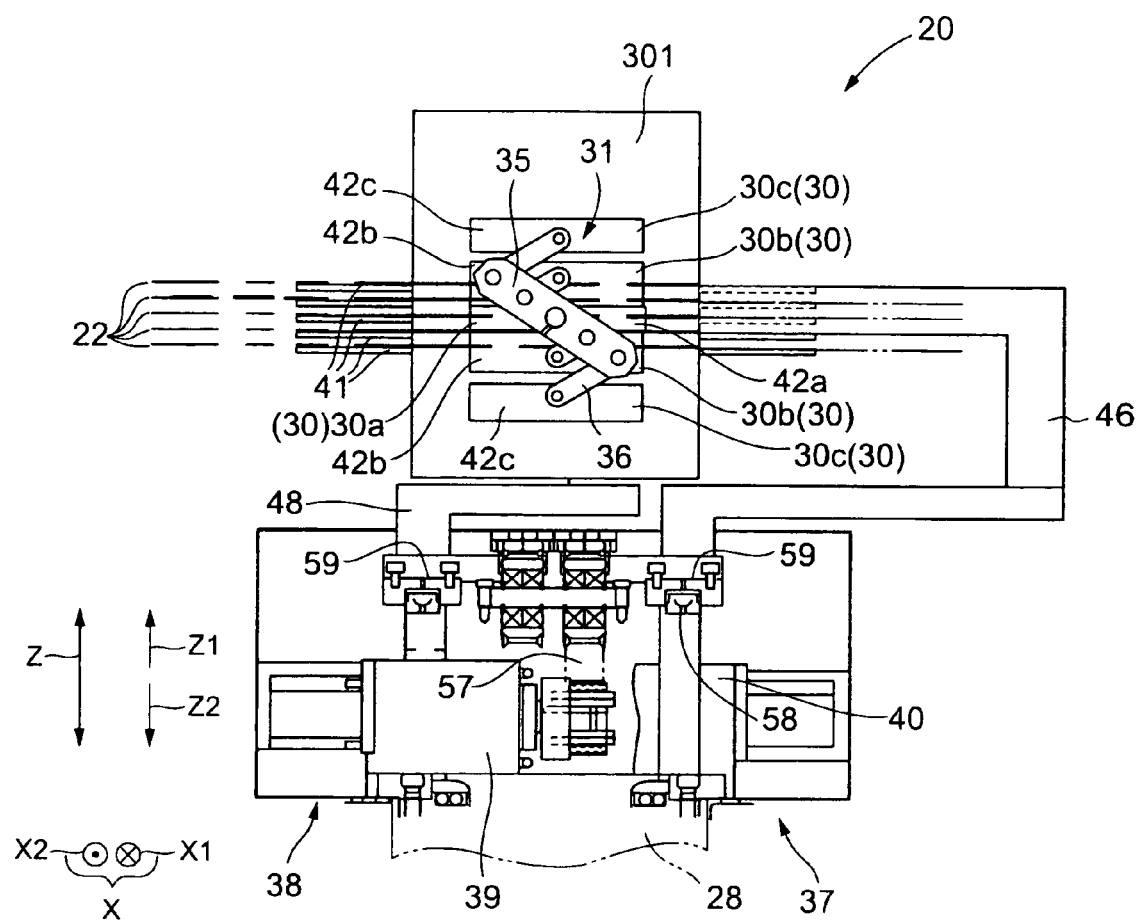
FIG. 2 is a rear view of the substrate carrying system including the substrate holding device shown in FIG. 1 taken in the direction of the arrow S2.
Figure 3:
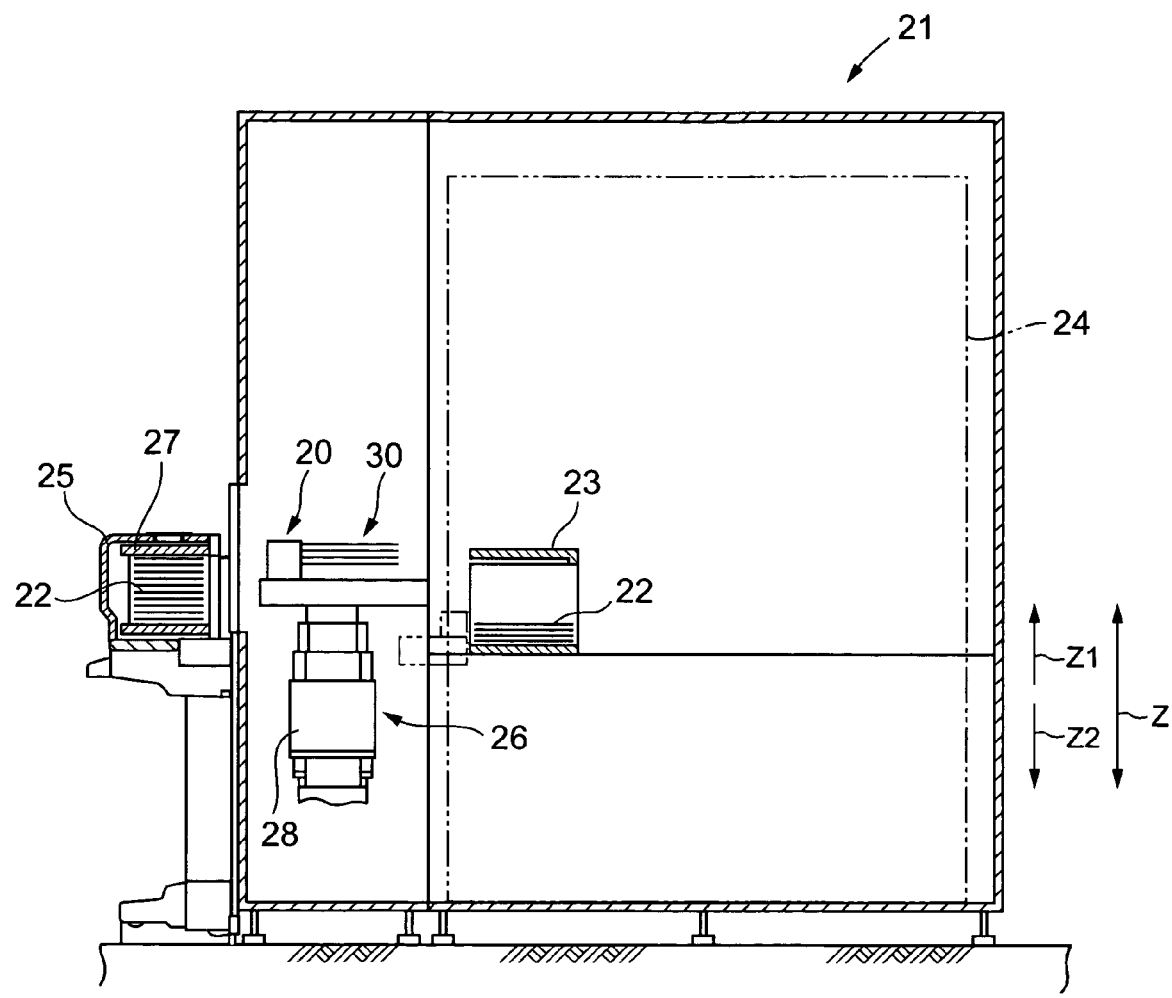
FIG. 3 is a schematic sectional view of a semiconductor device fabricating system.

Referring to FIGS. 1 to 3, semiconductor wafers (hereinafter, referred to simply as "wafers") 22 are subject to an oxidizing process, an annealing process, a chemical vapor deposition process (CVD process) or a diffusion process in fabricating semiconductor devices on the wafers. The wafers 22 have the shape of a thin disk of, for example, 300 mm in diameter and 0.7 mm in thickness.

Referring to FIG. 3, the semiconductor device fabricating system 21 includes a semiconductor device fabricating apparatus 24, a hoop 25 and a substrate carrying device 26. The semiconductor device fabricating apparatus 24 processes wafers 22 held in a buffer 23 by a predetermined process. The hoop holds a cassette 27 for containing wafers 22.

The buffer 23 is a process wafer holder capable of holding wafers 22 in a vertical stack along, for example, the Z-axis. Similarly, the cassette 27 holds wafers 22 in a vertical stack along the Z-axis. Wafers 22 are held in the cassette 27 and the buffer 23 with their peripheral parts seated on a plurality of projections 4a and 4b. The cassette 27 is capable of holding about thirty wafers 22.

The cassette 27 holding a plurality of wafers 22 is carried to and held in the hoop 25. The cassette 27 held in the hoop 25 is adjacent to the semiconductor device fabricating apparatus 24. The cassette 27 is placed in the hoop 25. Then the substrate carrying device 26 carries the wafers 22 contained in the cassette 22 simultaneously and places the wafers in the buffer 23.

The semiconductor device fabricating apparatus 24 processes the wafers 22 held in the buffer 23 one by one or simultaneously by a predetermined process. The processed wafers 22 are returned to the buffer 23. The substrate carrying device 26 carries the processed wafers 22 simultaneously from the buffer 23 into the cassette 27. The cassette 27 holding the processed wafers 22 is carried to the next process.

The substrate carrying device 26 includes a substrate holding deice 20 for holding wafers 22, and a substrate carrying device 28 for carrying the substrate holding device 20. The substrate carrying device 28 is an articulated robot capable of carrying the substrate holding device 20 in directions along, for example, three orthogonal axes.

The substrate holding device 20 is provided with blades 41. Pitches of the blades 41 with respect to a direction parallel to the Z-axis are adjusted on the basis of information about the condition of arrangement of the wafers 22. Thus the blades 41 can be inserted in spaces between the wafers 22 with sufficient clearances between the blades 41 and the wafers 22 regardless of the condition of arrangement of the wafers 22.

Referring to FIGS. 1 and 2, the substrate holding device 20 includes a plurality of holding members 30 for holding wafers 22, a linkage 31 for coordinately moving the holding members 30, and a drive motor 32 for coordinately moving the holding members 30. For example, the drive motor 32 is fixedly mounted on a frame included in the substrate holding device 20 and has a drive shaft directly coupled to a brake. The drive motor 32 is driving means for driving the linkage 31. The substrate holding device 20 is provided with a rotary transmission 300. The rotation of the drive shaft of the drive motor 32 is transmitted through the rotary transmission 300 to the linkage 31.

The rotary transmission 300 is a gear transmission. The rotary transmission 300 may be a belt-drive transmission. A brake brakes the drive shaft of the drive motor 32 after the drive motor 32 has been stopped to prevent the holding members 30 from being moved by external force, such as gravity.

Each holding members 30 are able to move vertically along the Z-axis. The linkage 31 includes a driving link 35 and driven links 36. The drive motor 32 drives the driving link 35 for angular displacement to move the holding members vertically along the Z-axis.

The holding members 30 are movable in directions intersecting directions parallel to the Z-axis. In this embodiment, the holding members 30 are movable in horizontal directions parallel to the X-axis perpendicular to the Z-axis. The substrate holding device 20 further includes moving mechanisms 37 and 38 for moving the holding members 30 in directions parallel to the X-axis, and drive motors 39 and 40 for moving the holding members 30 in directions parallel to the X-axis. The drive motors 39 and 40 are actuated to move the holding members 30 in directions parallel to the X-axis. The drive motors 32, 39 and 40 are driving means for driving the holding members 30 for shifting.

The substrate holding device 20 further includes a controller 34. The controller 34 controls the drive motors 32, 39 and 40 on the basis of mapping information about the condition of arrangement of the wafers 22 to shift the holding members 30 to positions suitable for holding the wafers 22, respectively. The controller 34 may serve also as a robot controller for controlling the robot 28.

Figure 4:
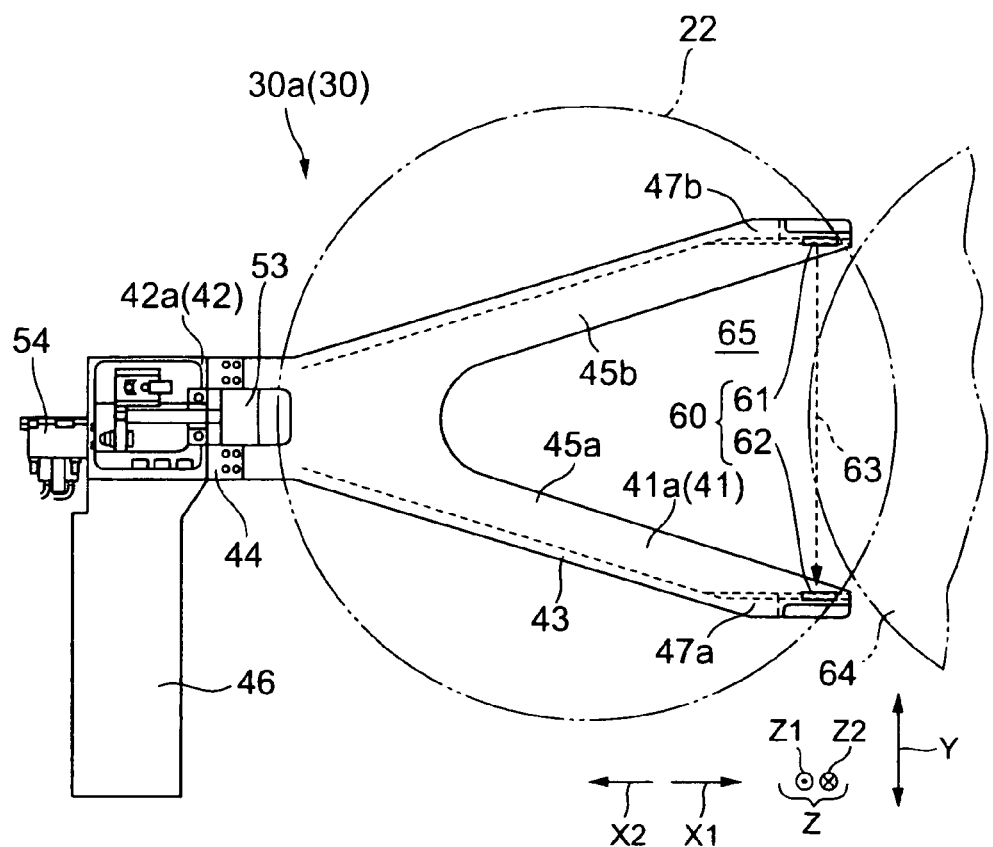
FIG. 4 is a plan view of a first holding member.
Figure 5:
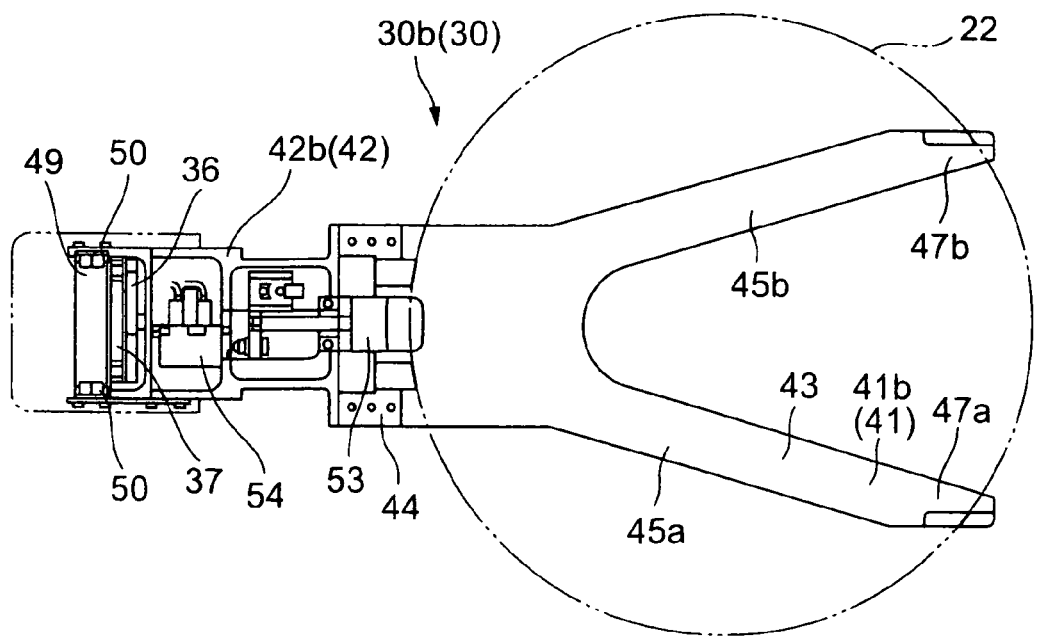
FIG. 5 is a plan view of a second holding member.
Figure 6:
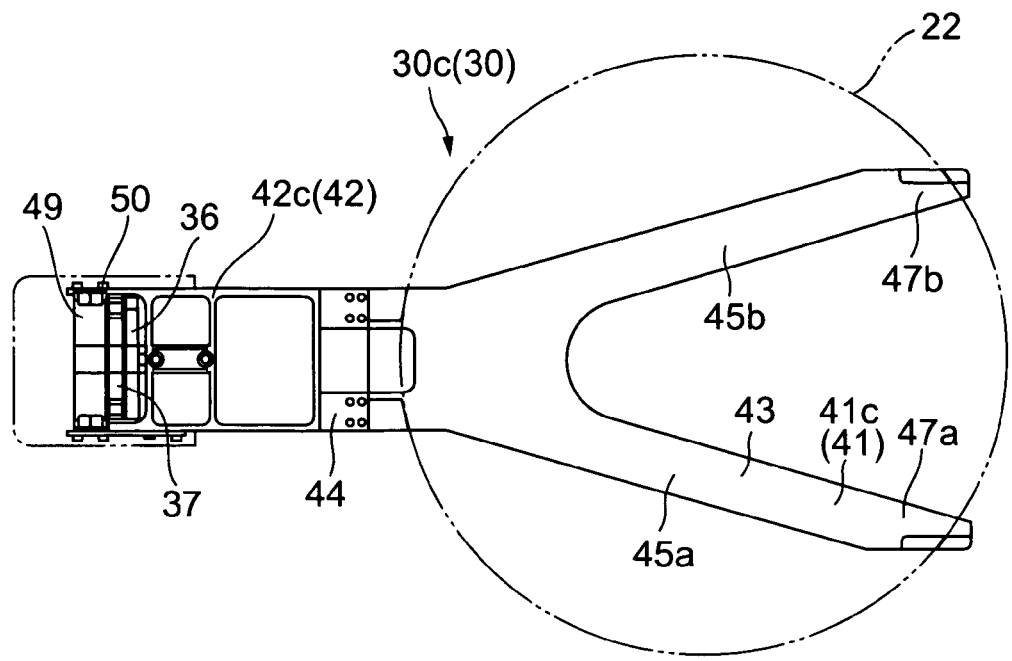
FIG. 6 is a plan view of a third holding member.

FIGS. 4 to 6 show the holding members 30a, 30b and 30c in plan views, respectively. As shown in FIGS. 1 and 2, the holding members 30 are arranged vertically along the Z-axis. The substrate holding device 20 in this embodiment has the five holding members 30, i.e., an odd number of holding members. The five holding members 30 are one first holding member 30a, two second holding members 30b and two third holding members 30c.

The first holding member 30a shown in FIG. 4 is the middle holding member among the five vertically stacked holding members 30. The second holding members 30b shown in FIG. 5 are on the opposite sides, respectively, of the first holding member 30a.

The upper and the lower third holding member 30c shown in FIG. 6 overlies the upper second holding member 30b and underlies the lower second holding member 30b, respectively. Sometimes, the first holding member 30a, the second holding members 30b and the third holding members 30c are designated inclusively by holding members 30 in the following descriptions.

Each of the holding members 30 (30a, 30b, 30c) has a blade 41 (41a, 41b, 41c), and a blade holder 42 (42a, 42b, 42c) holding the blade 41. The blades 41 of all the holding members 30 have the same flat shape. The blades 41 are stacked vertically at equal intervals. One of the surfaces of each blade 41 serves as a hold surface 43 for holding the wafer 22 thereon. The hold surface 43 is horizontal and is shaped so as to hold the wafer 22 stably thereon. The blades 41 are thin enough to be inserted in spaces between the vertically stacked wafers 22 and have a thickness of, for example, 3.5 mm.

The blades 41 in this embodiment are Y-shaped. Each blade 41 has a base 44 connected to the blade holder 42 and extending in a moving direction, and two hold arms 45a and 45b extending from the base part 44. The two hold arms 45a and 45b extend generally in a direction X1 from the base part 44 and diverge from each other with respect to directions parallel to the Y-axis. The wafer 22 is held stably on the blade 41 with parts thereof seated on end parts 47a and 47b of the hold arms 45a and 45b, and the base 44, respectively. The respective blade holders 42 (42a, 42b, 42c) of the first holding member 30a, the second holding members 30b and the third holding members 30c have different shapes, respectively.

As shown in FIG. 1, the blade holder 42a of the first holding member 30a is fastened to a first moving member 46 capable of moving in directions parallel to the X-axis. The first moving member 46 is moved in directions parallel to the X-axis by the first moving mechanism 37 to move the first holding member 30a together with the first moving member 46 in directions parallel to the X-axis.

The respective blade holders 42b and 42c of the second holding members 30b and the third holding members 30c are supported through the links 35 and 36 by the second moving member 48 movable in directions parallel to the X-axis. The second moving mechanism 38 moves the second moving member 48 in directions parallel to the X-axis. The first moving member 46 and the second moving member 48 are able to move individually in directions parallel to the X-axis.

The second moving member 48 is provided with a guide member 49 for guiding the second holding members 30b and the third holding members 30c for vertical movement along the Z-axis. The respective blade holders 42b and 42c of the second holding members 30b and the third holding members 30c have joining parts 50 engaged with the guide member 49. Thus the guide member 49 guides the second holding members 30b and the third holding members 30c having the joining parts 50 engaged with the guide member 50 for vertical movement along the Z-axis relative to the second moving member 48. For example, the guide member 49 is a vertical rail, and the guide members 50 are sliders that slide along the guide rail. Thus the guide member 49 and the joining parts 50 form a linear sliding mechanism.

The blade holder 42a of the first holding member 30a, and the blade holders 42b of the second holding members 30b are provided with chucks 53 and chuck driving devices 54 for shifting the chucks 53 in directions parallel to the X-axis, respectively. Each of the chucks 53 is set in contact with the circumference of the wafer held on the blade 41 to position the wafer 22. The chuck 53 of the second holding member 30b extends through the adjacent third holding member 30c and is capable of simultaneously positioning both the wafers 22 held on the blades 41 of the second holding member 30b and the third holding member 30c. Thus the substrate holding device 20 is capable of accurately holding the wafers 22. The chuck driving device 54 is, for example, a pneumatic cylinder actuator.

Figure 7:
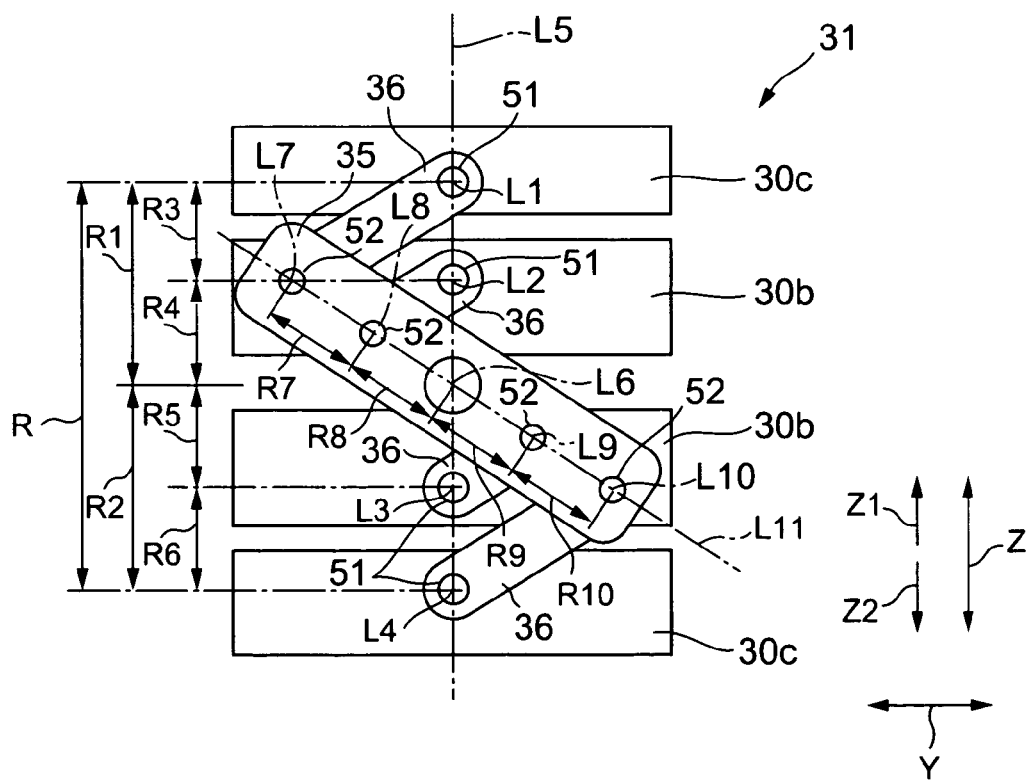
FIG. 7 is an enlarged rear elevation of a linkage.

Referring to FIG. 7 showing the linkage 31 in an enlarged view, the linkage 31 is an interlocking mechanism for vertically moving the second holding members 30b and the third holding members 30c along the Z-axis. The linkage 31 includes the driving link 35 and the driven links 36 pivotally joined to the driving link 35. The dimensions and arrangement of the links 35 and 36 are determined such that the vertical intervals between the adjacent holding members 30b and 30c change at the same rate when the driving link 35 is turned.

The driven links 36 are joined to the second holding member 30b and the third holding members 30c, respectively. End parts of the driven links 36 are joined pivotally to joining parts 51 formed on the second and third holding members 30b and 30c. The driving link 35 is joined to all of the driven links 36. The driving link 35 is provided with joining parts 52 respectively for the holding members 30b and 30c. The other end parts of the driven links 36 are joined pivotally to the joining parts 52, respectively. Thus the second holding members 30b and the third holding members 30c are interlocked with the driving link 35 by the driven links 36.

The driving link 35 and the driven links 36 have the shapes of strips, respectively. Each of the driven links 36 has the end part pivotally joined to the joining part 51 and the other end part pivotally joined to the joining part 52 of the driving link 35. The driven links 36 connected to the second holding members 30b and those connected to the third holding members 30c have different lengths, respectively. The driving link 35 is held for turning about a reference axis L6. The driving link 35 is driven by the drive motor 32 for turning about the reference axis L6.

Axes L1 to L4 about which the driven links 36 turn on the second holding members 30b and the third holding members 30c, respectively are parallel to the reference axis L6, and are arranged vertically on a vertical axis L5 indicated by a vertical imaginary line. The axes L1, L2, L3, L4 and L6 are spaced at equal intervals R3, R4, R5 and R6.

The reference axis L6 about which the driving link 35 turns lies at the middle of a range R between the upper third holding member 30c and the lower third holding member 30c. The distance R1 between the reference axis L6 and the axis L1 about which the link 36 joined to the upper third holding member 30c turns is equal to the distance R2 between the reference axis L6 and the axis L4 about which the link 36 joined to the lower third holding member 30c turns. The reference axis L6 about which the driving link 35 turns and the blade 41 of the first holding member 30a are at the same height.

Axes L7, L8, L9 and L10 about which the driven links 35 turn relative to the driving link 35 and the reference axis L6 about which the driving link 35 turns are arranged on a straight line L11 indicated by an imaginary line. The axes L7, L8, L6, L9 and L10 are arranged at equal intervals R7, R8, R9 and R10.

Figure 8A:
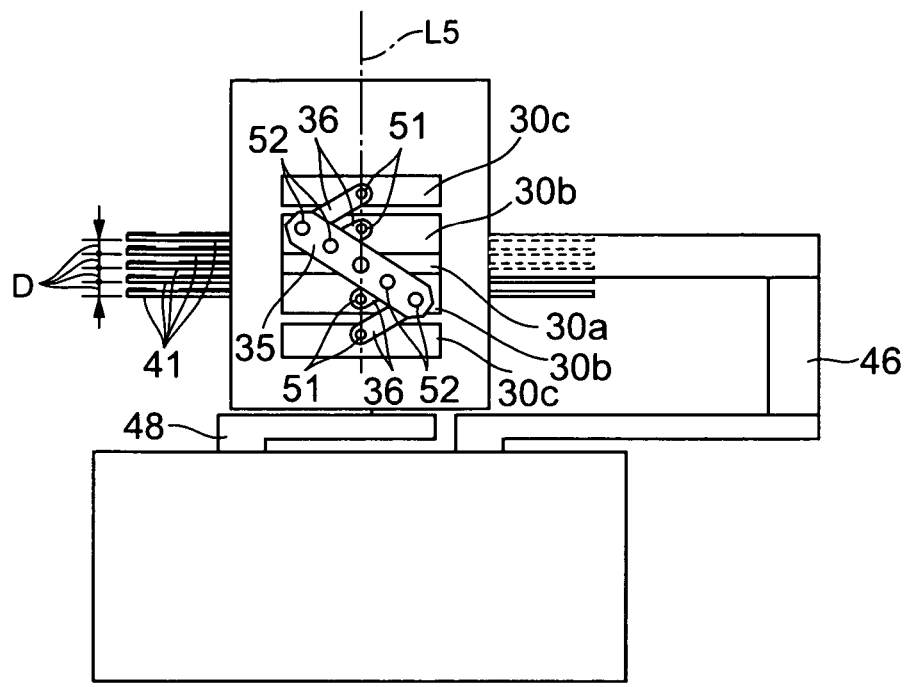
FIGS. 8A and 8B are views of assistance in explaining an interval changing operation for changing intervals between blades.
Figure 8B:
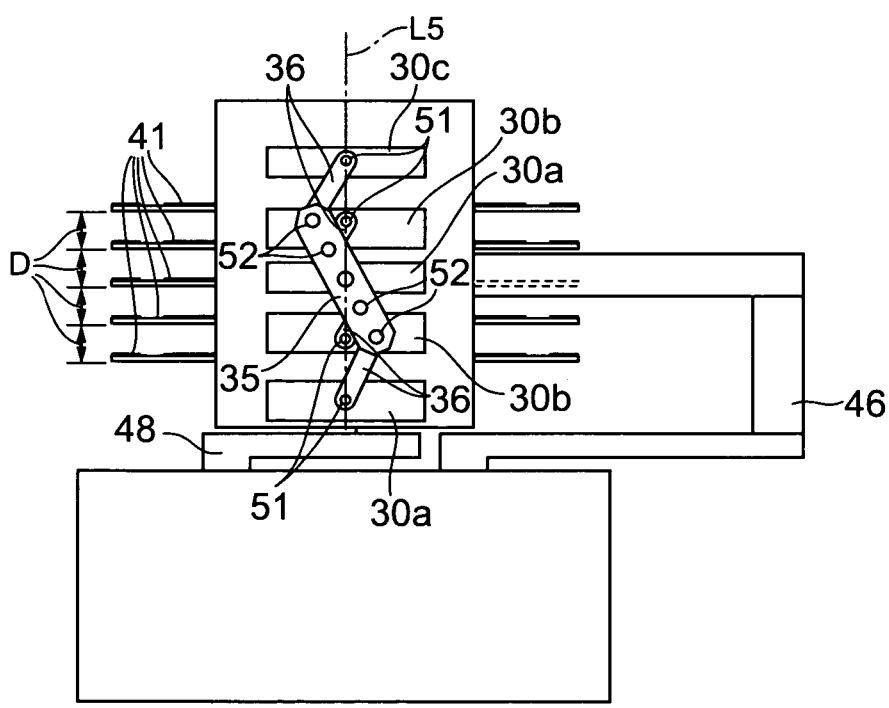

FIGS. 8A and 8B are views of assistance in explaining changing the intervals between the blades 41. The blades 41 are arranged at short intervals in FIG. 8A, and at long intervals in FIG. 8B.

The drive motor 32 turns the driving link 35 about the reference axis L6 through an angle to turn the joining parts 52 through the same angle about the reference axis L6. Consequently, the respective vertical positions of the joining parts 52 change, and the driven links 36 joined to the driving link 35 are turned on the joining parts 52 accordingly. Since the holding members 30b and 30c are guided for vertical movement along the Z-axis by the guide member 49, the joining parts 51 move along the straight vertical line L5.

Thus the driven links 36 are always parallel regardless of the angular displacement of the driving link 35 and hence the intervals between the holding members 30a, 30b and 30c change at the same rate according to the angular displacement of the driving link 35. In other words, the equal intervals between the blades 41 of the holding members 30a, 30b and 30c change equally.

For example, the pitches of the holding members 30a, 30b and 30c are adjusted to those of pitches of wafers held in a cassette as shown in FIG. 8A when the substrate holding device 20 accesses the cassette, and the pitches of the holding members 30a, 30b and 30c are adjusted to those different from those of pitches of wafers held in the cassette as shown in FIG. 8B when the substrate holding device 20 accesses a process substrate holder. For example, the pitches of the holding members when the substrate holding device 20 accesses the cassette are shorter than those when the substrate holding device 20 accesses the process substrate holder. The driving link 35 is pivotally held on the second moving member 48 as shown in FIG. 7. The drive motor 32 turns the driving link 35 through the rotary transmission 300. The drive motor 32 is mounted on the second moving member 48.

The first moving member 46 is moved in directions parallel to the X-axis by the first moving mechanism 37. The second moving member 48 is moved in directions parallel to the X-axis by the second moving mechanism 38. Since the first moving mechanism 37 and the second moving mechanism 38 are similar in construction, only the first moving mechanism 37 will be described by way of example.

Referring to FIG. 1, the moving mechanism 37 (the moving mechanism 38) includes a driving roller 56a, a driven roller 56b, a flexible, endless belt 57 extended between the driving roller 56a and the drive roller 56b, and a slider 59. The respective axes of the driving roller 56a and the drive roller 56b are parallel to the Y-axis. The driving roller 56a and the driven roller 56b are spaced with respect to a direction parallel to the X-axis. The belt 57 extended between the driving roller 56a and the driven roller 56b has a horizontal, straight part 57a extending along the X-axis.

The slider 59 is structured so as to be able to move in the X-axis. The slider 59 is engaged with a guide member 58 at a fitting portion of the guide member 58 for guiding the slider 59 for horizontal movement. The guide member 58 is, for example, a guide rail. The guide member 58 and the slider 59 constitute a sliding mechanism. The slider 59 is fastened to the straight part 57a of the belt 57.

The driving roller 56a is driven for rotation by a drive motor to turn the belt 57. Thus the slider fastened to the straight part 57a of the belt 57 moves in a direction parallel to the X-axis. The movement of the slider 59 can be reversed by reversing the rotation of the drive shaft of the driving roller 56a.

Referring to FIG. 2, the first moving mechanism 37 and the second moving mechanism 38 are driven by the first drive motor 39 and the second drive motor 40, respectively. The first moving mechanism 37 and the second moving mechanism 38 are able to operate individually. The first moving member 46 is fastened to the slider 59 of the first moving mechanism 37. The second moving member 48 is fastened to the slider 59 of the second moving mechanism 38. The first moving member 46 and the second moving member 48 can be individually moved along the X-axis. The construction of moving mechanisms 37 and 38 may be other than that described above.

Figure 9:
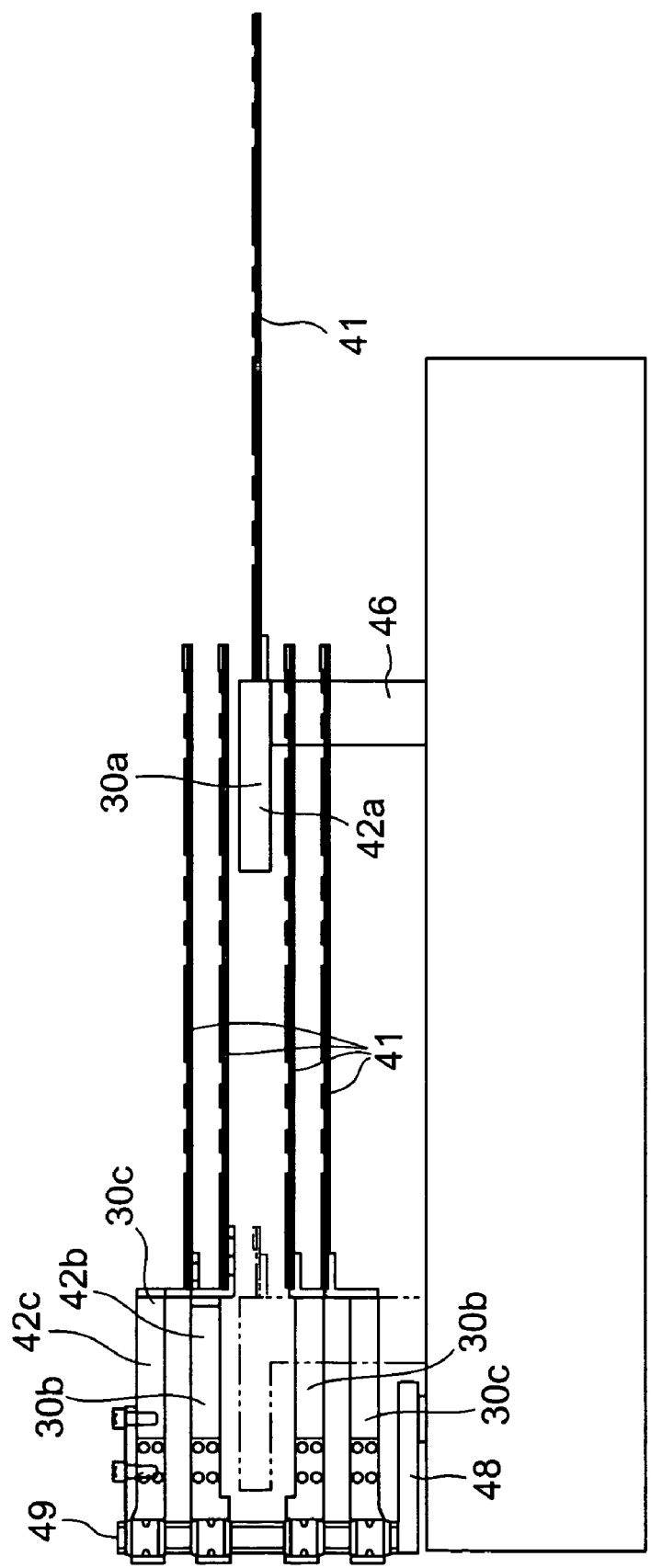
FIG. 9 is a side elevation of blades at increased intervals and the jutted blade of the first holding member.

FIG. 9 is a schematic view showing a state where the blade 41 of the first holding member 30a juts out from the stack of the rest of the blades 41. As mentioned above, the first moving member 46 and the second moving member 48 can be individually moved along the X-axis. The blade 41 of the first holding member 30a can jut out from the stack of blades 41 of the rest of the holding members 30b and 30c as shown in FIG. 9 by holding the second moving member 48 at a position and moving the first moving member 46 in the direction X1.

The substrate holding device 20 has a mapping unit 60 capable of providing mapping information about the condition of arrangement of the wafers 22 in the cassette and in the process substrate holder. As shown in FIG. 4, the mapping unit 60 is incorporated into the first holding member 30a. The mapping unit 60 is capable of measuring the pitches of the wafers 22 at least in the cassette and in the process substrate holder.

The mapping unit 60 is, for example, a transmission photosensor including a light projector 61 and a light receiver 62. The light projector 61 is attached to an end part 47a of a finger 45a, i.e., one of the two fingers 45 of the blade 41a of the first holding member 30a. The light receiver 62 is attached to an end part 47b of a finger 45b, i.e., the other finger 45. The light projector 61 projects a light beam toward the light receiver 62. The light receiver 62 provides a light reception signal upon the reception of the light beam projected by the light projector 61. Part of a wafer 22 held in a cassette or a process substrate holder can be received in a space 65 between the two fingers 45. Part of the wafer 22 received in the space 65 intercepts a light beam 63 projected by the light projector 61. Although the transmission photosensor is used as a mapping sensor in this embodiment, any suitable sensor, such as a reflection photosensor, other than the transmission photosensor may be used as a mapping sensor.

Figure 10:
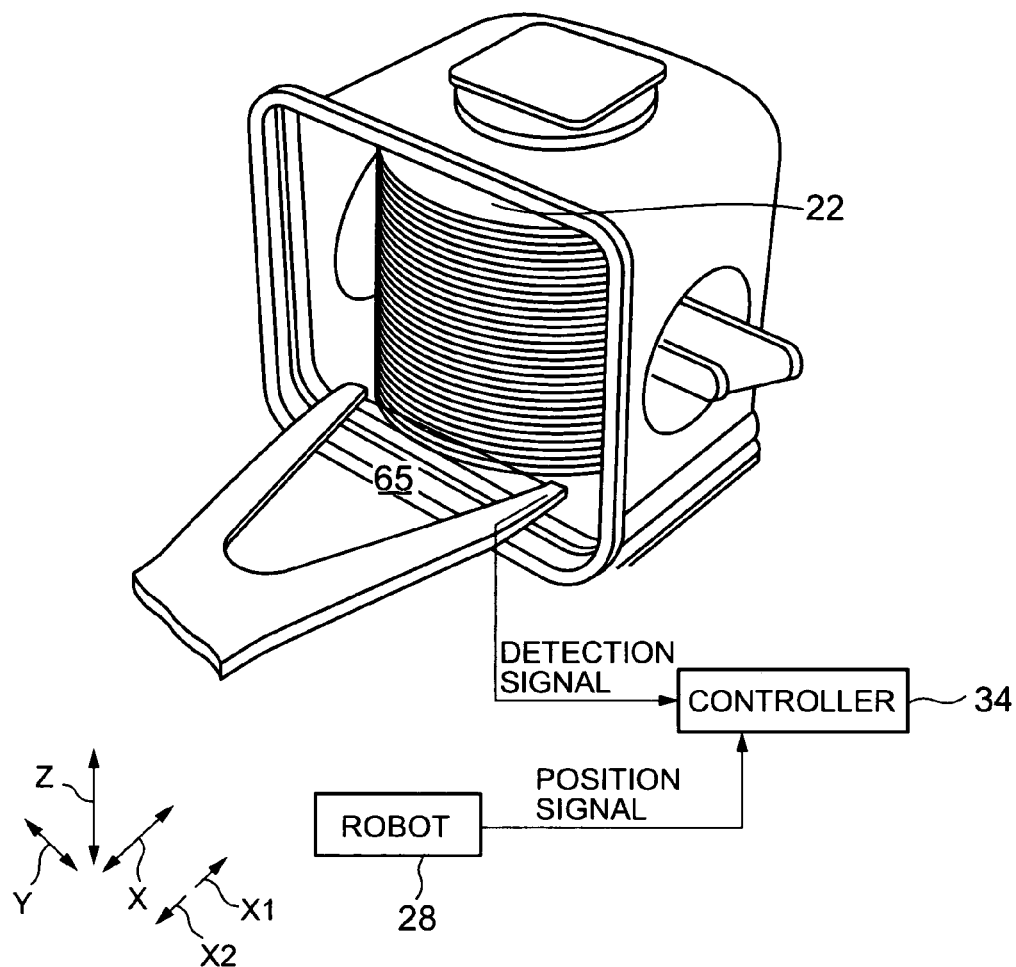
FIG. 10 is a perspective view of assistance in explaining a mapping operation.
Figure 12:
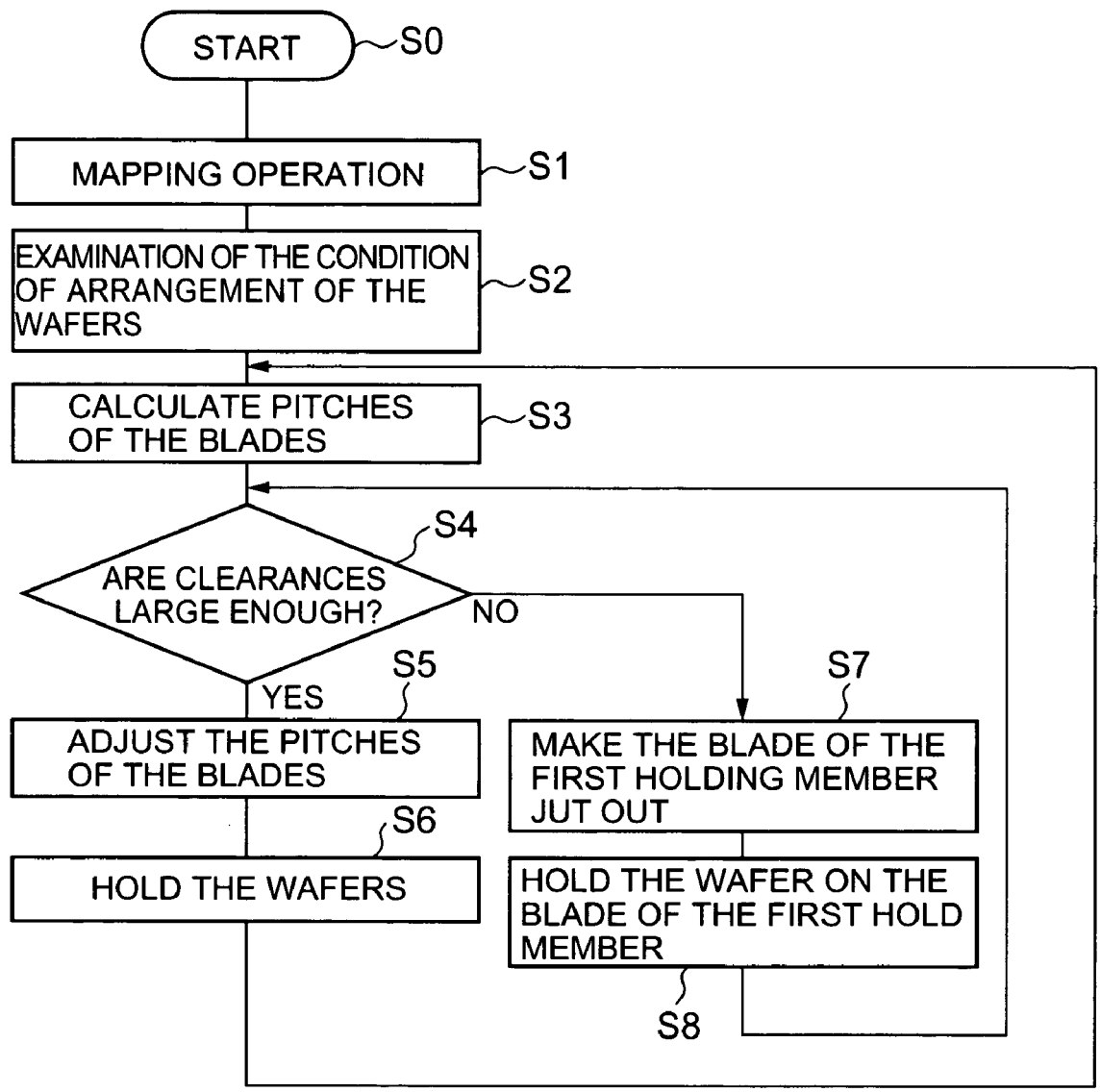
FIG. 12 is a flow chart of a substrate carrying procedure to be performed by the substrate holding device in the first embodiment.

FIG. 10 is a perspective view of assistance in explaining a mapping operation, and FIG. 12 is a flow chart of a substrate carrying procedure including a mapping operation and a carrying operation. The controller 34 provides a substrate carrying procedure start signal in step S0 in a state where a plurality of wafers 22 are stacked vertically along the Z-axis in a sending substrate holder.

In step S1, a mapping operation is started. The controller 34 controls the first drive motor 39 to move the first holding member 30a in the direction X1 so that the blade 41a of the first holding member 30a juts out from the stack of the blades 41 of the holding members 30b and 30c.

In step S2, the controller 34 controls the robot 28 to move the first holding member 30a in the direction X1 so that parts of the wafers 22 are included in a vertical mapping region including the space 65 between the hold arms 45a and 45b of the blade 41 of the first holding member 30a. In this state, a vertical plane including the light path of the light beam 63 projected by the light projector intersects the wafers 22.

In step S3, the controller 34 controls the robot 28 to move the first holding member 30a vertically. Then, the parts of the wafers 22 and spaces between the wafers 22 pass the space 65 defined by the blade 41 of the first holding member 30a alternately. The amount of light fallen on the light receiver 6 varies as the first holding member 30a moves vertically. After the blade of the first holding member 30a has passed all the wafers 22, step S4 is executed to move the first holding member 30a in a direction X2 so that the first holding member 30a is aligned with the second holding members 30b and the third holding members 30c to complete the mapping operation.

In step S3, the controller 34 obtains, in addition to data on the amount of light fallen on the light receiver 62, position data on the position of the light path of the light beam 63 projected by the light projector 61 provided by an encoder included in the robot 28, corresponding to the position of the first holding member 30a.

Figure 11:
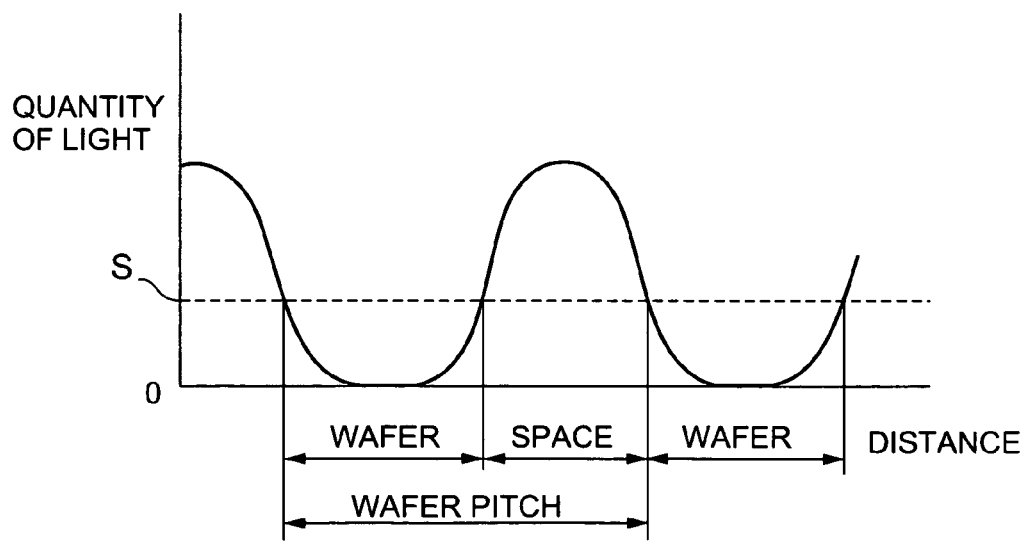
FIG. 11 is a graph showing the variation of the amount of received light with the positions of the first holding member.

FIG. 11 is a graph showing the variation of the amount of received light with the positions of the first holding member 30a. The controller 34 decides that the light path is at a position corresponding to the wafer 22 when the amount of light fallen on the light receiver 62 is smaller than a predetermined threshold S. The controller 34 decides that the light path is at a position corresponding to a space between the adjacent wafers 22 when the amount of light fallen on the light receiver 62 is larger than the threshold S. Thus, the controller 34 obtains mapping information about the respective vertical condition of arrangement of the wafers 22.

The controller 34 is able to determine the vertical pitches of the wafers 22 on the basis of the detection of the wafers 22 and the spaces between the wafers 22. The controller 34 may determine whether or not the wafers are stored in a horizontal position or a tilted position.

Figure 13:
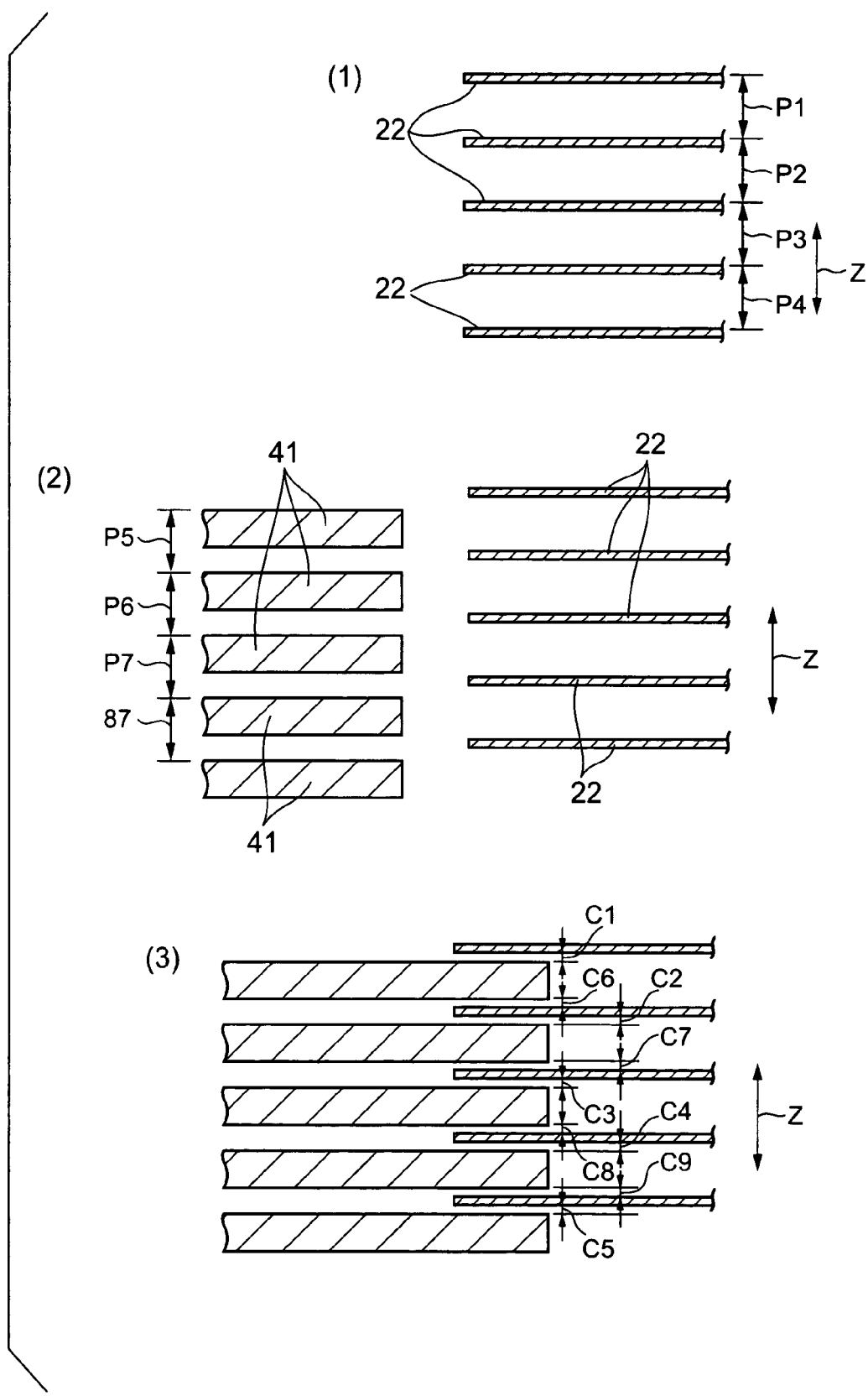
FIG. 13 is a sectional view of assistance in explaining a substrate holding operation.
Figure 14:
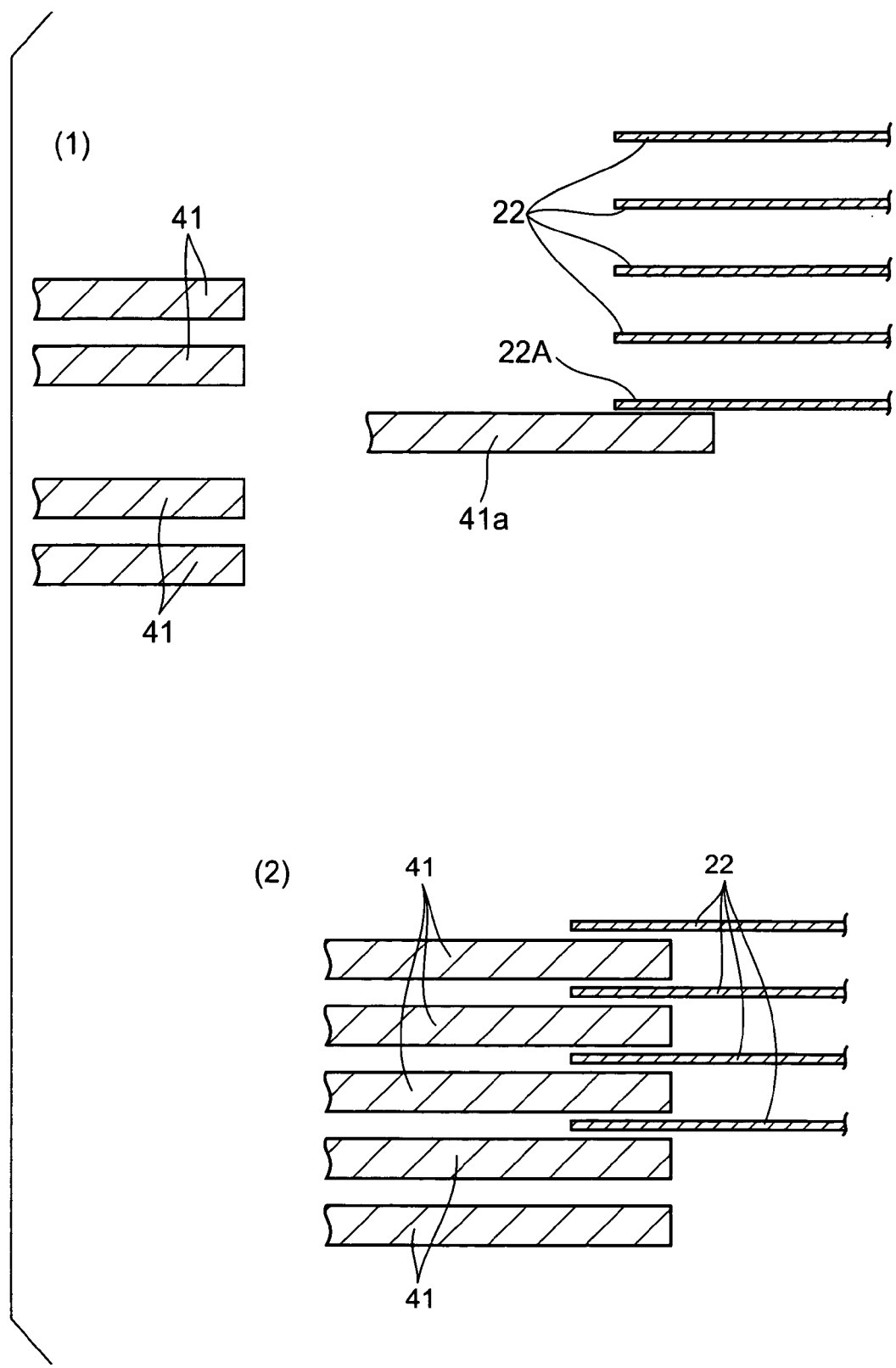
FIG. 14 is a sectional view of assistance in explaining a substrate holding operation.

FIG. 12 includes a flow chart of a substrate carrying procedure to be executed by the substrate holding device 20, and FIGS. 13 and 14 are sectional views of assistance in explaining the substrate carrying procedure. The controller 34 provides a substrate carrying procedure start signal in step S0.

In step S1, the controller 34 controls the robot 28 and the first drive motor 39 to carry out the mapping operation. Step S2 is executed after the completion of the mapping operation.

In step S2, the respective vertical condition of arrangement of the wafers 22 are determined on the basis of the mapping information obtained in step S1, and pitches P1, P2, P3 and P4 of the wafers 22 as shown in FIG. 13(1) are calculated. Each of the pitches P1 to P4 is the distance between the respective upper surfaces of the vertically adjacent wafers 22. The pitches of the wafers 22 change according to the secular distortion of a process substrate holder for holding wafers 22. In some cases, the pitches P1 to P4 change irregularly due to the secular distortion of the process substrate holder.

The condition of arrangement of the wafers 22, such as the inclinations of the wafers 22, may be examined in addition to the measurement of the pitches P1 to P4 of the wafers 22. If the wafers 22 are inclined, the controller 34 may decide that the wafers 22 are abnormally arranged, may provide an error signal, and may make a warning means provide a warning signal indicating the abnormal arrangement of the wafers 22.

After the controller 34 has recognized the conditions of the wafers 22, the controller 34 calculates the pitches P5, P6, P7 and P8 of the blades 41 suitable for properly holding the wafers 22 on the blades 41 in step S3 on the basis of the pitches P1 to P4 determined in step S2. As shown in FIG. 13(2), each of the pitches P5 to P8 is the vertical distance between the respective upper surfaces of the adjacent blades 41.

The linkage 31 positions the holding members 30 so that the blades 41 are arranged at the same pitches P5 to P8. The pitches P5 to P8 of the blades 41 are calculated by a predetermined algorithm. For example, the pitches P5 to P8 are equal to a value obtained by dividing the sum of the maximum pitch $P_{max}$ and the minimum pitch $P_{min}$ among the pitches P1 to P4 of the wafers 22 to be held on the blades 41 by two; that is, P5 to P8=$(P_{max}+P_{min})/2$.

The pitches P5 to P8 may be calculated by an algorithm other than the foregoing one. For example, the pitches P5 to P8 may be equal to the average of the pitches P1 to P4 of the wafers 22 to be held on the blades 41, the maximum pitch $P_{max}$, the minimum pitch $P_{min}$ or the mode of the pitches P1 to P4. Thus, the controller 34 calculates the pitches P5 to P8 of the blades 41 by the predetermined algorithm.

In step S4, clearances C1 to C9 between the blades 41 inserted in the spaces between the wafers 22, and the adjacent wafers 22 as shown in FIG. 13(3) are estimated. The clearances C1 to C5 are upper clearances between the lower surfaces of the wafers 22 and the lower surfaces of the adjacent blades 41, and the clearances C6 to C9 are lower clearances between the upper surfaces of the wafers 22 and the lower surfaces of the adjacent blades 41. The controller 34 decides that the wafers 22 can be simultaneously held on the blades 41 if the clearances C1 to C9 are greater than a predetermined value, and then executes step S5.

In step S5, the drive motor 32 is controlled to move the second holding members 30b and the third holding members 30c vertically along the Z-axis so that the blades 41 are arranged at the pitches P5 to P8 determined in step S3. In step S6, the controller 34 controls the drive motor 39, the drive motor 40 or the robot 28 to insert the blades 41 in the spaces between the wafers 22 by moving all the holding members 30 in the direction X1. Then, the substrate holding device 20 is raised to hold the wafers 22 on the hold surfaces 43 of the blades 41. Then, the substrate holding device 20 is moved in the direction X2 to take out the wafers 22 from the substrate holder.

The wafers 22 taken out from the substrate holder is put in another substrate holder, and then the substrate carrying procedure returns to step S3 to calculate the pitches of the blades 41 on the basis of mapping information about the positions of wafers 22 to be handled by the substrate holding device 20 for the next cycle of the substrate carrying procedure.

If it is decided in step S4 that any one of the calculated clearances is not larger than a predetermined value, step S7 is executed. In step S7, the first drive motor 39 is controlled to shift the first holding member 30a in the direction X1 so that the blade 41a of the first holding member 30a juts out from the stack of the rest of the blades 41 in the direction X1 as shown in FIG. 14(1), and then step S8 is executed.

In step S8, the controller 34 moves the blade 41a of the first holding member 30a to a position under the wafer 22A, of which the calculated clearance is not larger than the predetermined value, makes the blade 41a of the first holding member 30a hold the wafer 22A, and make the first holding member 30a carry the wafer 22A to a receiving wafer holder before carrying the rest of the wafers 22 to the receiving wafer holder. Then, the substrate carrying procedure returns to step S4.

In step S4, clearances C1 to C9 are estimated on an assumption that blades 41 are inserted in the spaces between the wafers 22 after removing the wafer 22A, and then the substrate carrying procedure goes to step S5 or step S7.

Since the wafer 22A, of which the calculated clearance is not larger than the predetermined value, has been carried to the wafer receiving holder, the rest of the wafers 22 can be simultaneously carried as obvious from FIG. 14(2). The moving speed of the blades 41 may be adjusted according to the clearances between the blades 41 and the adjacent wafers 22. For example, the blades 41 may be inserted in the spaces between the wafers 22 at a low speed if the clearances are small or at a high speed when the clearances are large. Thus the wafers 22 can be more surely held.

This cycle of operations is repeated to hold and carry simultaneously the plurality of wafers held in the sending wafer holder. After all the wafers held in the sending wafer holder have been carried, the controller 34 ends the substrate carrying procedure. The mapping operation does not need to be executed for every cycle of the wafer holding operation for holding the wafers 22. The mapping operation may be executed for the predetermined cycles of the wafer holding operation. The controller 34 may be provided with a storage device for storing the mapping information. The drive motors may be controlled on the basis of the mapping information stored in the storage device.

If a new wafer holder holds wafers 22 at pitches of 6.3 mm, the wafers 22 can be simultaneously carried by holding the wafers 22 on the blades 41 vertically arranged at pitches of 6.3 mm.

Table 1 shows clearances C1 to C9 between wafers 22 arranged at pitches P1 to P4 and the blades of a substrate holding device in a comparative example. The pitches P5 to P8 of the blades of the substrate holding device in the comparative example are fixed.

TABLE 1

| Pitches of the wafers | | Pitches P5 to P8 of the blades: 6 mm | | | |
|---|---|---|---|---|---|
| | | Upper clearance | | Lower clearance | |
| P1 | 6.1 mm | C1 | 1 mm | C6 | 0.9 mm |
| P2 | 6.1 mm | C2 | 0.9 mm | C7 | 1 mm |
| P3 | 6.0 mm | C3 | 0.8 mm | C8 | 1 mm |
| P4 | 6.3 mm | C4 | 0.8 mm | C9 | 1.3 mm |
| | | C5 | 0.5 mm | | |

The pitches P5 to P8 of the blades 41 of the substrate holding device in the comparative example is fixed at 6 mm even if the pitches P1 to P4 of the wafers 22 held in the wafer holder change due to the secular distortion of the wafer holder. Therefore, in some cases the clearances are excessively small. For example, if the clearance C5 is as small as 0.5 mm as shown in Table 1, it is possible that the blade 41 collides against the wafer 22.

Table 2 shows clearances C1 to C9 between wafers 22 arranged at pitches P1 to P4 and the blades 41 of the substrate holding device 20 of the present invention. The pitches P5 to P8 of the blades 41 of the substrate holding device 20 of the present invention can be changed according to the pitches P1 to P4 of the wafers 22.

TABLE 2

| Pitches of the wafers | | Pitches P5 to P8 of the blades: 6.15 mm | | | |
|---|---|---|---|---|---|
| | | Upper clearance | | Lower clearance | |
| P1 | 6.1 mm | C1 | 1 mm | C6 | 0.9 mm |
| P2 | 6.1 mm | C2 | 1.05 mm | C7 | 0.85 mm |
| P3 | 6.0 mm | C3 | 1.1 mm | C8 | 0.7 mm |
| P4 | 6.3 mm | C4 | 1.25 mm | C9 | 0.85 mm |
| | | C5 | 1.1 mm | | |

The substrate holding device 20 of the present invention prevents the reduction of the clearances due to the change or dispersion of the pitches P1 to P4 of the wafers. When the substrate holding device 20 of the present invention is used, the clearances are not smaller than 0.7 mm, which reduces the possibility of the collision of the blades 41 against the wafers 22.

In the substrate holding device 20 according to the present invention, the controller 34 controls the drive motor 32 on the basis of the mapping information about the condition of arrangement of the substrates 22 to move the holding members 30 coordinately by the linkage 31. Thus the holding members 30 are shifted to positions where the holding members 30 are able to hold the plurality of wafers 22, respectively. The respective positions of the holding members 30 are adjusted according to the condition of arrangement of the wafers 22 before holding the wafers 22. The holding members 30 are able to hold the plurality of wafers 22 surely and simultaneously regardless of the condition of arrangement of the wafers 22.

For example, if the wafer holder, i.e., the cassette 27 or the buffer 23, holding the wafers 22 has been distorted due to aging, and the pitches P1 to P4 of the wafers 22 held in the wafer holder are different from the initial pitches, the vertical positions of the holding members 30 of the substrate holding device 20 are adjusted according to the pitches P1 to P4 of the wafers 22 before holding the wafers 22. Consequently, the blades 41 of the holding members 30 are able to advance into the spaces between the wafers 22 with proper clearances formed between the blades 41 of the holding members 30 and the wafers 22 without colliding against the wafers (substrates) 22. The substrate holding device 20 is capable of coping with changes in the condition of arrangement of the wafers and dimensional errors in the wafer holder as well as the secular distortion of the wafer holder.

Since the blades 41 can be inserted in the spaces between the wafers 22 with sufficient clearances formed between the blades 41 and the wafers 22, it is scarcely possible that the blades 41 touch the wafers 22 when the same advance into the spaces between the substrates and hence the wafers 22 can be prevented from damaging. Thus the yield of the processed wafers can be improved. Since sufficient clearances are formed between the holding members 30 and the adjacent wafers 22, the plurality of holding members 30 can be quickly advanced into the spaces between the wafers 22 and the holding operation can be quickly achieved. The substrate holding device 20 is able to hold the wafers 22 surely even if the wafer holder has dimensional errors. The possibility of the blades 41 touching the wafers 22 and damaging the wafers 22 can be further reduced by adjusting the speed of movement of the blades 41 into the spaces between the wafers 22 according to the clearances between the blades 41 and the adjacent wafers 22.

The controller 34 moves the first holding member 30a in the direction X1 to make the blade 41a of the first holding member 30a juts out from the vertical stack of the rest of the holding members 30b and 30c when the holding members 30 are unable to hold the wafers 22 even if the holding members 30 are shifted along the Z-axis on the basis of the mapping information. The blade 41a of the first holding member 30a thus moved advances into the space between the adjacent wafers 22, and holds and takes out the wafer 22 that is an obstruct to the simultaneous holding of the plurality of wafers 22 to enable the blades 41 of the holding members 30b and 30c to hold the wafers 22 simultaneously. Subsequently, the controller 34 advances the second holding members 30b and the third holding members 30c to insert the blades 41 thereof in the spaces between the wafers 22 to hold the rest of the wafers 22 simultaneously.

Even if the wafers 22 are arranged in an arrangement that makes the plurality of wafers 22 unable to be held simultaneously, the substrate holding device 20 is able to hold the plurality wafers 22 further surely and simultaneously by individually shifting the first holding member 30a in the direction X1 to enable the plurality wafers 22 held simultaneously on the blades 41. This individual wafer holding operation of the first holding member 30a can be achieved for both taking out the wafer 22 out from the cassette and taking out the wafer 22 from the process substrate holder.

Since the substrate holding device 20 includes the mapping unit 60 that provides the mapping information, any other mapping means is not necessary. The substrate holding device 20 is able to move vertically together with the mapping unit 60 to handle the plurality of vertically arranged wafers 22 and hence the mapping unit 60 can easily determine the respective positions of the vertically arranged wafers 22. The mapping unit 60 has the light projector 61 and the light receiver 62 attached to the end parts of the two fingers 45 of the blade 41a of the first holding member 30a. The mapping operation is performed after shifting the first holding member 30a so that the blade 41a of the first holding member 30a juts out from the arrangement of the blades 41 of the rest of the holding members 30b and 30c and hence the blade 41a can be moved for the mapping operation without interfering with the rest of the blades 41.

The linkage 31 interlocking the second holding members 30b and the third holding members 30c is capable of moving the second holding members 30b and the third holding members 30c by turning the driving link 35 and the driven links 36 without using any ball screws. Thus the driving force of the drive motor 32 can be transmitted to the second holding members 30b and the third holding members 30c through the linkage 31, and the second holding members 30b and the third holding members 30c can be shifted simply by turning the driving link 35 and the driven links 36, namely, the sliding members, for small angular displacements. The linkage 31, as compared with the ball screw, has the small sliding members. Since the small sliding members are turned for small angular displacements, the amount of dust produced by the sliding members can be reduced. Therefore, the substrate holding device 20 is suitable for operation in a regulated atmosphere, such as an atmosphere of a clean room.

The substrate holding device 20 provided with the linkage 31 does not need any driving mechanism for individually driving the holding members 30, is simple in construction and can be manufactured at a low cost. The substrate holding device 20 of simple construction is small and lightweight.

The second holding members 30b and the third holding members 30c on the opposite sides of the first holding member 30a, namely, the middle holding member, are moved toward and away from the first holding member 30a. With respect to the first holding member 30a, one of the second and third holding members 30b, 30c at one side in the vertical direction and the other of the second and third holding members 30b, 30c at the other side in the vertical direction move vertically in opposite directions with each other. A clearance between the holding members 30 changes in accordance with movements of the second and third holding members 30b, 30c.

In the substrate holding device as a comparative example, the holding members arranged on one side of the stationary holding member at one of the ends of the arrangement of the holding members move toward and away from the stationary holding member, and the holding member at the other end of the arrangement of the holding members is distant from the stationary holding member. Therefore, the link for moving the holding member at the other end of the arrangement of the holding members of the substrate holding device in a comparative example is longer than those for moving the end holding members of the substrate holding device 20 of the present invention. In other words, the driving link 35 interlocking the holding members 30 of the substrate holding deice of the present invention is short as compared with the links of the linkage of the substrate holding device in a comparative example. Consequently, the second holding members 30b and the third holding members 30c can be moved by a small moment of force, and the driving device for moving the second holding members 30b and the third holding members 30c may be of a small power capacity.

The chuck 53 of the second holding member 30b extends through the adjacent third holding member 30c and is capable of simultaneously positioning both the wafers 22 held on the blades 41 of the second holding member 30b and the third holding member 30c. Since the second holding members 30b are moved in a range narrower than that in which the third holding members 30c are moved, the driving force of the drive motor 32 necessary for moving the holding members 30 when the chucks 53 and the chuck driving devices 54 are combined with the second holding members 30b may be lower than that necessary for the same purpose when the chucks 53 and the chuck driving devices 54 are combined with the third holding members 30c. The driving force of the drive motor 32 can be reduced by incorporating members that are used by both the second holding members 30b and the third holding members 30c into the second holding members 30b. The chucks 53 and the chuck driving devices 54 may be omitted.

Figure 15:
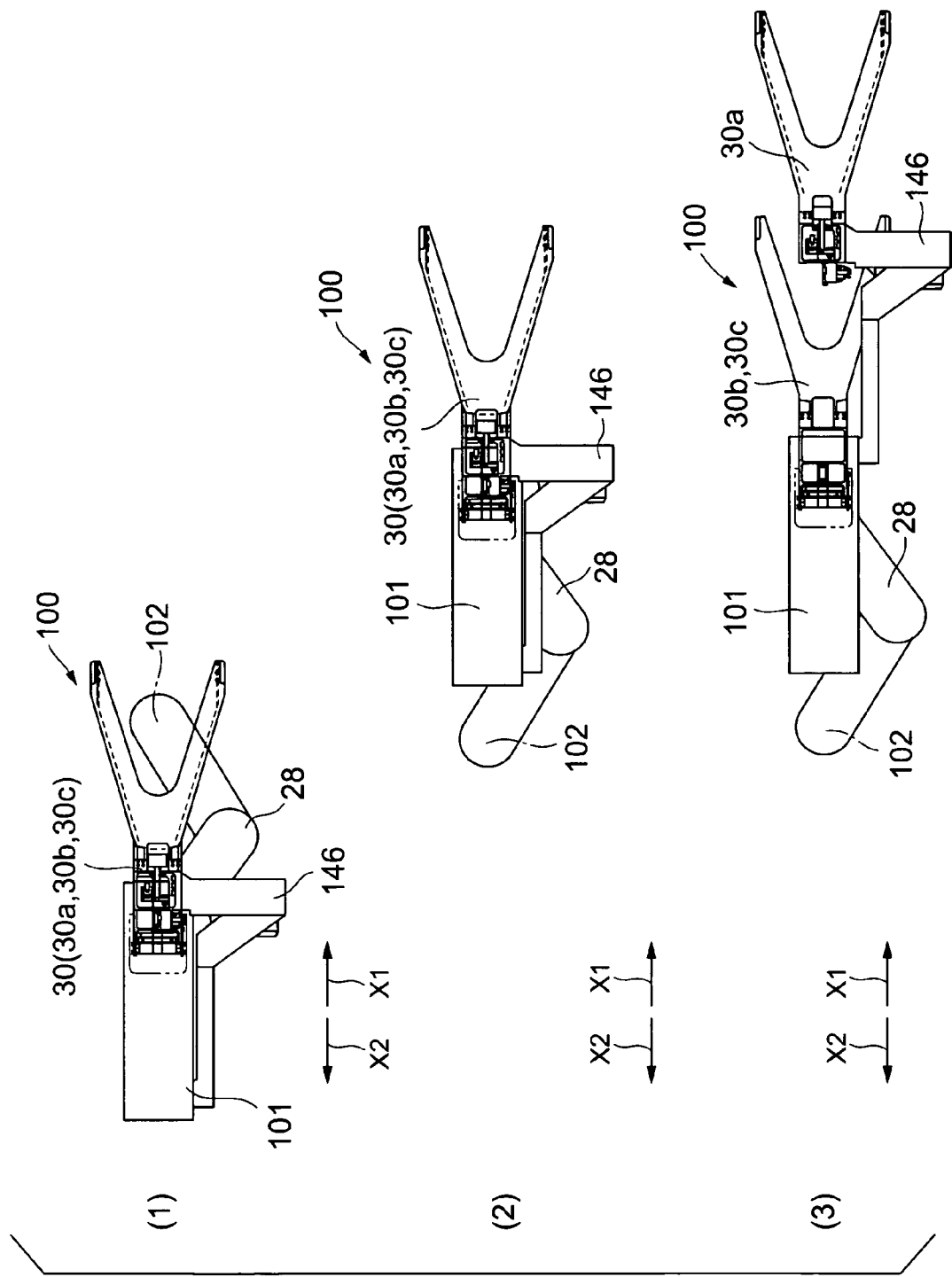
FIG. 15 is a fragmentary plan view of a substrate holding device in a second embodiment according to the present invention.

FIG. 15 shows a first holding member 30a, a second holding member 30b and a third holding member 30c included in a substrate holding device 100 in a second embodiment according to the present invention. FIG. 15(1) shows a state that the holding members 30a, 30b and 30c are shifted simultaneously in a direction X2 from their home positions. FIG. 15(2) shows a state that the holding members 30a, 30b and 30c are shifted simultaneously in a direction X1 opposite the direction X2 from their home positions. FIG. 15(3) shows a state that the first holding member 30a is shifted individually in the direction X1 relative to the second holding member 30b and the third holding member 30c.

A moving mechanism for shifting the holding members 30 of the substrate holding device 100 shown in FIG. 15 is different from that of the substrate holding device 20 shown in FIG. 1. The substrate holding device 100 in the second embodiment is the same in other respects as the substrate holding device 20 in the first embodiment. Therefore, parts of the substrate holding device 100 like or corresponding to those of the substrate holding device 20 are denoted by the same reference characters and the description thereof will be omitted.

The substrate holding device 100 has a base 101 connected to the free end of the robot arm of an articulated robot. The base 101 can be moved in horizontal directions parallel to the X-axis. The holding members 30a, 30b and 30c are mounted on the base 101. The second holding member 30b and the third holding member 30c can be in vertical directions parallel to the Z-axis and are restrained from movement along the X-axis relative to the base 101. A drive motor 32 and a guide member 49 are mounted on the base 101. The base 101 is moved along the X-axis by the articulated robot 28. The holding members 30 mounted on the base 101 can be moved together with the base 101 in directions parallel to the X-axis relative to a robot base 102 included in the articulated robot 28 as shown in FIGS. 15(1) and 15(2).

The first holding member 30a is fastened to a first moving member 146 connected to the base 101. The first moving member 146 can be moved relative to the base 101 in directions parallel to the X-axis by a moving mechanism, such as a ball screw. The first moving member 146 holding the first holding member 30a can be moved in a direction X1 such that the first holding member 30a juts out from the arrangement of the second holding member 30b and the third holding member 30c as shown in FIG. 15(3).

The blades of the holding members 30 can be inserted in spaces between wafers 22 by moving the holding members 30 along the X-axis by the robot 28. The first holding member 30a can jut out from the arrangement of the second holding member 30b and the third holding member 30c to carry out a mapping operation and to hold a wafer 22 individually. Thus the substrate holding device 100 in the second embodiment is able to operate similarly to the substrate holding device 20 in the first embodiment for the same effect.

The substrate holding devices 20 and 100 are only examples of the present invention and various changes can be made therein. Although the substrate holding devices of the present invention have been described as applied to hold the wafers 22, the substrate holding devices can be applied to hold substrates other than the wafers 22, such as glass substrates.

Although the substrate holding device 20 includes the mapping unit 60, the mapping unit 60 may be separated from the substrate holding device 20, provided that the controller 34 is able to control the drive motors 32, 39 and 40 on the basis of the mapping information. Although the substrate holding device 20 has been described on an assumption that the substrate holding device 20 is provided with the single first holding member 30a, the two second holding members 30b and the two third holding members 30c for holding the five wafers 22, the substrate holding device 20 may be provided with more than five holding members to hold more than five wafers 22 simultaneously.

Although the substrate holding device 20 has been described on an assumption that the wafers 22 are arranged vertically along the Z-axis, the wafers 22 may be arranged along any direction. Similarly, the first holding member 30a may be movable in any direction instead of being movable in the direction intersecting the vertical direction.

Although the substrate holding device 20 has both a function to adjust the pitches of the blades 41 and a function to hold a single wafer on one of the blades 41, the wafers 22 can be simultaneously held when the substrate holding device 20 has either of the functions. For example, even if the second holding members 30b and the third holding members 30c cannot be vertically moved, the plurality of wafers 22 can be simultaneously held on the blades 41 by holding the wafer 22 obstructing the simultaneous hold of the wafers 22 and transferring the same to the receiving holder before holding the rest of the wafers 22.

Although the invention has been described in its preferred embodiments with a certain degree of particularity, obviously many changes and variations are possible therein. It is therefore to be understood that the present invention may be practiced otherwise than as specifically describe herein without departing from the scope and spirit thereof.

What is claimed is:

1. A substrate holding device comprising:
a plurality of holding members configured to hold a plurality of substrates, the holding members being arranged along a predetermined arranging direction and being movable along the arranging direction;
an interlocking mechanism interlocking the holding members for simultaneous coordinate movement along the arranging direction to change intervals between the holding members with respect to the arranging direction;
driving means for driving the holding members for shifting at least along the arranging direction;
a mapping unit for obtaining information; and
control means for controlling the driving means to shift the holding members to substrate taking positions where the holding members are able to hold substrates, respectively, in accordance with a mapping information about a condition of arrangement of the substrates arranged along the arranging direction, the mapping information including information about actual pitches between the substrates with respect to the arranging direction.

2. The substrate holding device according to claim 1, wherein at least one of the holding members is a projectable holding member which is able to move in a jutting direction intersecting the arranging direction,
the driving means drives the projectable holding member for shifting along the jutting direction, and
the control means controls the driving means, when it is impossible to hold the substrates by the holding members, respectively, even if the holding members are shifted in the arranging direction, so that the projectable holding member is shifted along the jutting direction and holds a substrate in accordance with the mapping information, and then a rest of holding members are shifted to substrate taking positions where the rest of holding members are able to hold a rest of substrates, respectively.

3. The substrate holding device according to claim 1, further comprising chuck means for positioning the substrate held on the holding member, the chuck means having a movable chuck which is configured to be moved between a first position where the movable chuck is in contact with a circumference of the substrate held on the holding member and a second position where the movable chuck is retracted from the first position.

4. A substrate holding device comprising:
a plurality of holding members arranged along a predetermined arranging direction, at least one of the holding members being a projectable holding member which is able to move in a jutting direction intersecting the arranging direction;
driving means for driving the projectable holding member for shifting along the jutting direction;
a mapping unit for obtaining a mapping information; and
control means for controlling the driving means,
when it is impossible to hold the substrates by the holding members, respectively, to shift the projectable holding member so as to hold a substrate in accordance with a mapping information about a condition of arrangement of the substrates arranged along the arranging direction, the mapping information including information about actual pitches between the substrates with respect to the arranging direction.

5. The substrate holding device according to claim 1 further comprising mapping means for determining the condition of arrangement of the substrates arranged along the arranging direction.

6. The substrate holding device according to claim 1, wherein:
the interlocking mechanism includes a linkage having a plurality of links which are linked so as to turn relative to each other, and capable of shifting the holding members along the arranging direction to change intervals between the holding members, and
the driving means drives at least one of the links for angular displacement.

7. A substrate holding device comprising:
an odd number, which is not less than three, of holding members arranged along a predetermined arranging direction and capable of being shifted along the arranging direction, the holding members including a middle holding member which is located at a middle position in the arranging direction;
a linkage including a plurality of links linked for angular displacement so as to shift the holding members along the arranging direction to change intervals between the holding members, the links including a plurality of driven links having ends pivotally joined to the holding members excluding the middle holding member, and a driving link pivotally joined to the middle holding member so as to be able to turn about a reference axis passing the middle holding member perpendicularly to the arranging direction and pivotally joined to other ends of the driven links;
driving means for driving the driving link for angular displacement about the reference axis; and
control means for controlling the driving means so that the holding members are shifted to substrate taking positions where the holding members are able to hold substrates.

8. The substrate holding device according to claim 7, wherein the ends of the driven links, which are pivotally joined to the holding members excluding the middle holding member, are arranged in a line at equal intervals along a first straight line included in a plane perpendicular to the reference axis, and the other ends of the driven links and the reference axis are arranged in a line at equal intervals along a second straight line included in a plane perpendicular to the reference axis.

9. The substrate holding device according to claim 7, wherein when the holding members are adapted to be moved in a predetermined carrying direction toward the substrates, the driving link and the driven links are extended in a plane perpendicular to the carrying direction on a back side with respect to the carrying direction.

10. A substrate carrying system comprising:
the substrate holding device according to claim 1; and
a moving device configured to move the substrate holding device.

11. A substrate holding method using a plurality of holding members arranged along a predetermined arranging direction so as to be movable along the arranging direction, the holding members being configured to simultaneously hold a plurality of substrates arranged along the arranging direction, the substrate holding method comprising:
obtaining mapping information from a mapping unit about a condition of arrangement of the substrates, the mapping information including information about actual pitches between the substrates with respect to the arranging direction;

calculating pitches of the holding members with respect to the arranging direction based on the mapping information; and holding the substrates on the holding members after shifting the holding members along the arranging direction so that the holding members are arranged at calculated pitches.

12. A substrate holding method using a plurality of holding members arranged along a predetermined arranging direction and including at least one projectable holding member capable of being moved in a jutting direction perpendicular to the arranging direction, the holding members being configured to simultaneously hold a plurality of substrates arranged along the arranging direction, the substrate holding method comprising:

obtaining a mapping information from a mapping unit about a condition of arrangement of the substrates, the mapping information including information about actual pitches between the substrates with respect to the arranging direction;

shifting the projectable holding, member when it is impossible to hold the substrates by the holding members so as to hold and remove a substrate, which thereby makes it possible for the holding members to hold the substrates so that rest of the substrates can be held on rest of the holding members in accordance with the mapping information; and holding the rest of the substrates on the rest of the holding members.

13. The substrate holding device according to claim 2, further comprising chuck means for positioning the substrate held on the holding member, the chuck means having a movable chuck which is configured to be moved between a first position where the movable chuck is in contact with a circumference of the substrate held on the holding member and a second position where the movable chuck is retracted from the first position.

* * * * *